United States Patent
Tachibana

(10) Patent No.: US 12,494,760 B2
(45) Date of Patent: Dec. 9, 2025

(54) FILTER DEVICE, ANTENNA DEVICE, AND ANTENNA MODULE

(71) Applicant: Murata Manufacturing Co., Ltd., Nagaokakyo (JP)

(72) Inventor: Shinya Tachibana, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 110 days.

(21) Appl. No.: 18/391,743

(22) Filed: Dec. 21, 2023

(65) Prior Publication Data
US 2024/0120897 A1    Apr. 11, 2024

Related U.S. Application Data

(63) Continuation of application No. PCT/JP2022/025295, filed on Jun. 24, 2022.

(30) Foreign Application Priority Data

Jul. 2, 2021    (JP) .................. 2021-111022

(51) Int. Cl.
*H03H 7/01* (2006.01)
*H01Q 1/50* (2006.01)

(52) U.S. Cl.
CPC ............. *H03H 7/0115* (2013.01); *H01Q 1/50* (2013.01)

(58) Field of Classification Search
CPC ................. H03H 7/0115; H03H 7/175; H03H 2001/0085; H03H 7/09; H01Q 1/50; H01Q 21/28; H01Q 1/521
See application file for complete search history.

(56) References Cited

U.S. PATENT DOCUMENTS

| | | | |
|---|---|---|---|
| 2004/0251985 A1 | 12/2004 | Guitton et al. | |
| 2013/0076454 A1* | 3/2013 | Imamura | H03H 7/09 333/176 |
| 2018/0041182 A1 | 2/2018 | Nishida et al. | |

FOREIGN PATENT DOCUMENTS

| | | | | |
|---|---|---|---|---|
| JP | 2004312741 A | 11/2004 | | |
| WO | WO-2005036741 A1 * | 4/2005 | ........... | H03H 7/1783 |
| WO | 2016167171 A1 | 10/2016 | | |
| WO | 2018092453 A1 | 5/2018 | | |

OTHER PUBLICATIONS

International Search Report in PCT/JP2022/025295, mailed Sep. 6, 2022, 3 pages.
Written Opinion in PCT/JP2022/025295, mailed Sep. 6, 2022, 4 pages.

* cited by examiner

*Primary Examiner* — Seung H Lee
(74) *Attorney, Agent, or Firm* — Keating & Bennett, LLP

(57) ABSTRACT

A filter device includes first and second terminals, a first inductor located between the first and second terminals, and an LC series resonator connected in parallel to the first inductor and including a first capacitor and a second inductor. The first and second inductors are magnetically coupled to each other. An inductance of the first inductor is smaller than an inductance of the second inductor.

20 Claims, 20 Drawing Sheets

FILTER DEVICE, ANTENNA DEVICE, AND ANTENNA MODULE

CROSS REFERENCE TO RELATED APPLICATIONS

This application claims the benefit of priority to Japanese Patent Application No. 2021-111022 filed on Jul. 2, 2021 and is a Continuation application of PCT Application No. PCT/JP2022/025295 filed on Jun. 24, 2022. The entire contents of each application are hereby incorporated herein by reference.

BACKGROUND OF THE INVENTION

1. Field of the Invention

The present disclosure relates to filter devices, antenna devices, and antenna modules, or more specifically, to techniques to improve steepness of an attenuation band.

2. Description of the Related Art

International Publication No. WO2016/167171 discloses a filter device in which a second inductor is connected in parallel to a series circuit including a first inductor and a first capacitor. The first inductor and the second inductor are coupled to each other via a magnetic field in such a direction to cause magnetic fluxes thereof to enhance each other.

In International Publication No. WO2016/167171, an effective inductance of the first inductor and the second inductor increases due to magnetic field coupling. Accordingly, an inductance of each of the first inductor and the second inductor is reduced. In this way, the filter device of International Publication No. WO2016/167171 can reduce a resistance component of a parallel resonator and improve a Q factor.

High-frequency waves in various frequency bands have been put into use in recent years. Accordingly, there is a case where a filter device has, as a pass band, a band located close to an attenuation band. When the pass band is located close to the attenuation band, there may be a case of insufficient steepness of the attenuation band in the filter device disclosed in International Publication No. WO2016/167171.

SUMMARY OF THE INVENTION

Preferred embodiments of the present invention provide filter devices for high-frequency signals each with improved steepness of an attenuation band, thus reducing or preventing a loss that may occur when a high-frequency signal in a band located close to the attenuation band passes through the filter devices.

In a filter device according to a preferred embodiment of the present invention, a pass band is a first frequency band and an attenuation band is a second frequency band lower than the first frequency band. The filter device includes a first terminal, a second terminal, a first inductor, and an LC series resonator. The first inductor is located between the first terminal and the second terminal. The LC series resonator is connected in parallel to the first inductor, and includes a first capacitor and a second inductor. The first inductor and the second inductor are magnetically coupled to each other. An inductance of the first inductor is smaller than an inductance of the second inductor.

In filter devices according to preferred embodiments of the present invention, an LC parallel resonator is configured such that an inductance of a first inductor is smaller than an inductance of the second inductor. The above-described configuration makes it possible to improve steepness of an attenuation band as compared to a configuration in which an inductance of a first inductor becomes larger than an inductance of a second inductor, and to reduce or prevent a loss that may occur when a high-frequency signal in a band located close to the attenuation band passes through the filter device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
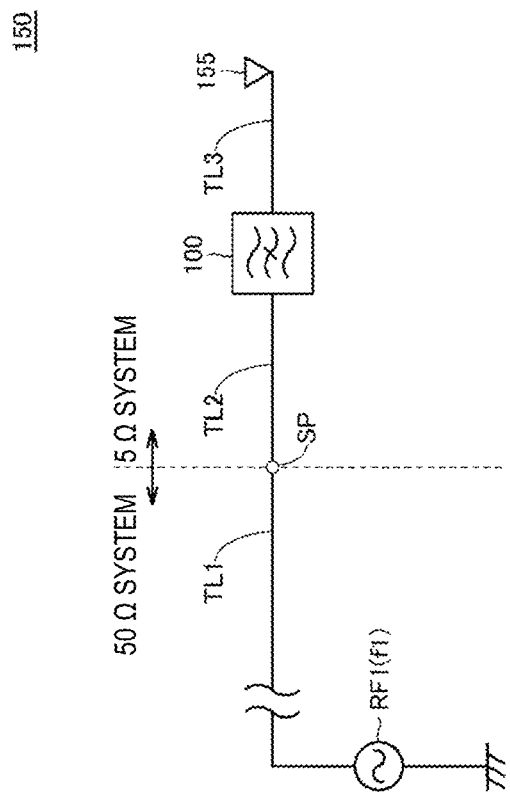
FIG. 1 is a diagram illustrating a configuration of an antenna device according to Preferred Embodiment 1 of the present invention.

Preferred embodiments of the present disclosure will be described below in detail with reference to the drawings. The same or corresponding portions in the drawings will be denoted by the same reference signs and explanations thereof will not be repeated.

Preferred Embodiment 1

Basic Configuration of Antenna Device

FIG. 1 is a diagram illustrating a configuration of an antenna device 150 according to Preferred Embodiment 1 of the present invention. The antenna device 150 includes a power supply circuit RF1, a filter device 100, and an antenna 155. The antenna device 150 is mounted on, for example, a portable terminal such as a cellular phone, a smartphone, and a tablet, or on a communication device such as a personal computer provided with a communication function.

The power supply circuit RF1 supplies a high-frequency signal in a frequency band of a band f1 to the antenna 155. The antenna 155 can emit the high-frequency signal of the band f1 supplied from the power supply circuit RF1 into the air as a radio wave. The frequency band of the band f1 is a 5 GHz band (about 5.15 GHz to about 5.7 GHz) of Wi-Fi (registered trademark), for example. The antenna 155 is a monopole antenna, for example.

The filter device 100 is, for example, a trap filter that prevents a high-frequency signal in a specific frequency band from passing through the filter device 100 and causes the signal to attenuate. The filter device 100 is also referred to as a band elimination filter. The filter device 100 of Preferred Embodiment 1 is configured to cause a high-frequency signal in a frequency band of a band f2 to be attenuated. The frequency band of the band f2 is a band that includes n77 (about 3.3 GHz to about 4.2 GHz) and n78 (about 3.3 GHz to about 3.8 GHz) of 5G-NR (New Radio), for example. The band f1 and the band f2 are the frequency bands that are located close to each other. Whether or not the frequency bands are located close to each other is determined by using a band width and a center frequency relative to the band width. For example, the band f1 and the band f2 are determined to be located close to each other in a case where a ratio of a band width between a frequency end of the band f1 and a frequency end of the band f2 to a center frequency relative to the band width falls within a predetermined range. Here, whether or not the frequency bands are located close to each other may be determined in accordance with other methods. Regarding the filter device 100, the band f1 is a pass band while the band f2 is an attenuation band.

The antenna device 150 includes transmission lines TL1, TL2, and TL3. The transmission line TL1 and the transmission line TL2 are electrically connected at a connecting point SP. The transmission line TL1 (a first transmission line) is a transmission line from the connecting point SP to either the power supply circuit RF1 or another structure disposed on the power supply circuit RF1 side. Specifically, one end of the transmission line TL1 is connected to the power supply circuit RF1 or another structure located on the power supply circuit RF1 side, while another end of the transmission line TL1 is connected to the transmission line TL2 (a second transmission line) at the connecting point SP.

The transmission line TL2 is a transmission line from the connecting point SP to the filter device 100. Specifically, one end of the transmission line TL2 is connected to the transmission line TL1 at the connecting point SP, while another end of the transmission line TL2 is connected to the filter device 100. The transmission line TL3 (a third transmission line) is a transmission line from the filter device 100 to the antenna 155. Specifically, one end of the transmission line TL3 is connected to the filter device 100 while another end of the transmission line TL3 is connected to the antenna 155. Although the example in which the filter device 100 is connected to the antenna 155 is described in FIG. 1, the filter device 100 may be connected to a power amplifier or the like, for example.

Equivalent Circuit Diagram of Filter Device 100

Figure 2:
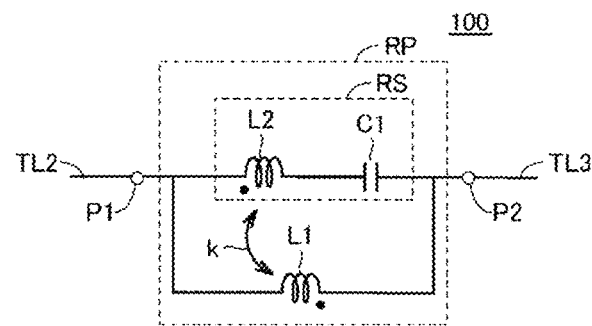
FIG. 2 is an equivalent circuit diagram of a filter device according to Preferred Embodiment 1 of the present invention.

FIG. 2 is an equivalent circuit diagram of the filter device 100. A terminal P1 is to connect the filter device 100 to the transmission line TL2. A terminal P2 is to connect the filter device 100 to the transmission line TL3 on the antenna 155 side.

In the case where the power supply circuit RF1 supplies the high-frequency signal to the antenna 155 through the filter device 100, the terminal P1 defines and functions as an input terminal and the terminal P2 defines and functions as an output terminal. In the case where the high-frequency signal received by the antenna 155 is transmitted to a circuit on the power supply circuit RF1 side through the filter device 100, the terminal P1 defines and functions as the output terminal and the terminal P2 defines and functions as the input terminal. The filter device 100 is not provided with a ground electrode and is structured as an integrated component.

The filter device 100 includes an inductor L1, an inductor L2, and a capacitor C1. An LC series resonator RS is an LC series resonator provided by connecting the inductor L2 and the capacitor C1 in series. The LC series resonator RS is provided between the terminal P1 and the terminal P2.

The inductor L1 is connected in parallel to the LC series resonator RS. In other words, the inductor L1 is also provided between the terminal P1 and the terminal P2. An LC parallel resonator RP is provided by connecting the inductor L1 and the LC series resonator RS in parallel.

The inductor L1 is magnetically coupled to the inductor L2 in such a direction to cause magnetic fluxes thereof to enhance each other. Thus, a mutual inductance M is generated between the inductor L1 and the inductor L2. The magnetic coupling between the inductor L1 and the inductor L2 is additive polarity coupling. In other words, when a current flows from the terminal P1 toward the terminal P2 in FIG. 2, a direction of a magnetic field generated at the inductor L1 and a direction of a magnetic field generated at the inductor L2 are opposite to each other. In the filter device 100 of Preferred Embodiment 1, an inductance of the inductor L1 is smaller than an inductance of the inductor L2. The filter device 100 causes a high-frequency signal in a resonant frequency band to attenuate without passing the high-frequency signal through the filter device 100 by use of the LC parallel resonator RP and the LC series resonator RS illustrated in FIG. 2. A location of the inductor L2 and a location of the capacitor C1 in the LC series resonator RS may be reversed. The filter device 100 may include other structures such as a switch and a circuit for impedance matching.

Regarding Reactance Characteristics of Typical LC Parallel Resonator

Next, a non-limiting example of a method for improving steepness of the LC parallel resonator RP of Preferred Embodiment 1 will be described by using an example of a typical LC parallel resonator. The typical LC parallel resonator means an LC parallel resonator in which only an inductor and a capacitor are connected in parallel unlike the LC parallel resonator RP that includes the LC series resonator RS as illustrated in FIG. 2.

Figure 3:
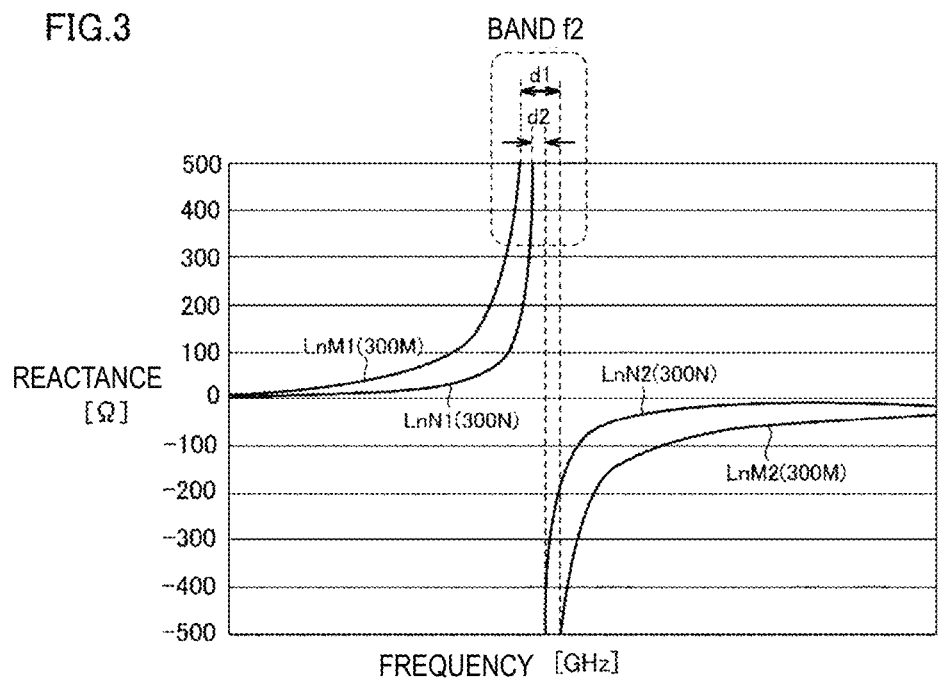
FIG. 3 is a diagram for explaining reactance characteristics of typical LC parallel resonators.

FIG. 3 is a diagram for explaining reactance characteristics of typical LC parallel resonators 300M and 300N. FIG. 3 illustrates lines LnM1, LnM2, LnN1, and LnN2 that each represent reactance of the LC parallel resonator 300M and the LC parallel resonator 300N. A horizontal axis indicates frequencies of high-frequency signals and a vertical axis indicates reactance values of the LC parallel resonators.

While each of the LC parallel resonator 300M and the LC parallel resonator 300N represents an example of the typical LC parallel resonator in which the inductor and the capacitor are connected in parallel, the LC parallel resonator 300M and the LC parallel resonator 300N are configured such that inductance values of the inductors and capacitance values of the capacitors included therein are different from one another.

Specifically, for example, the inductance of the inductor in the LC parallel resonator 300N is about 1 nH and the capacitance of the capacitor therein is about 3 pF. The inductance of the inductor in the LC parallel resonator 300M is about 3 nH and the capacitance of the capacitor therein is about 1 pF. The line LnN1 and the line LnN2 each show the reactance of the LC parallel resonator 300N. The line LnM1 and the line LnM2 each show the reactance of the LC parallel resonator 300M.

The LC parallel resonator 300N resonates in a frequency band between a frequency at which an absolute value of the line LnN1 converges infinitely and a frequency at which an absolute value of the line LnN2 converges infinitely. Thus, this frequency band defines an attenuation band d2 of the LC parallel resonator 300N. Similarly, the LC parallel resonator 300M resonates in a frequency band between a frequency at which an absolute value of the line LnM1 converges infinitely and a frequency at which an absolute value of the line LnM2 converges infinitely. Thus, this frequency band defines an attenuation band d1 of the LC parallel resonator 300M. The LC parallel resonators 300M and 300N are configured such that the attenuation band d1 and the attenuation band d2 are included in the frequency band of the band f2.

As illustrated in FIG. 3, the attenuation band d2 of the LC parallel resonator 300N with the inductance of the inductor smaller than that of the LC parallel resonator 300M is narrower than the attenuation band d1 of the LC parallel resonator 300M. In other words, in the typical LC parallel resonator in which the inductor and the capacitor are connected in parallel, the attenuation band is narrow and steepness is improved by reducing the inductance of the inductor connected in parallel.

The inductor L1 in the LC parallel resonator RP illustrated in FIG. 2 corresponds to the inductors in the typical LC parallel resonators 300M and 300N described in FIG. 3. In other words, in the filter device 100 having the configuration of the equivalent circuit illustrated in FIG. 2, it is possible to narrow the attenuation band of the filter device 100 by reducing the inductance of the inductor L1 corresponding to the inductor of the typical LC parallel resonator.

Regarding Resonant Frequency in LC Parallel Resonator RP

Next, a non-limiting example of a method of reducing the inductance of the inductor L1 in the LC parallel resonator RP in order to further improve steepness of the LC parallel resonator RP of Preferred Embodiment 1 will be described.

Figure 4:
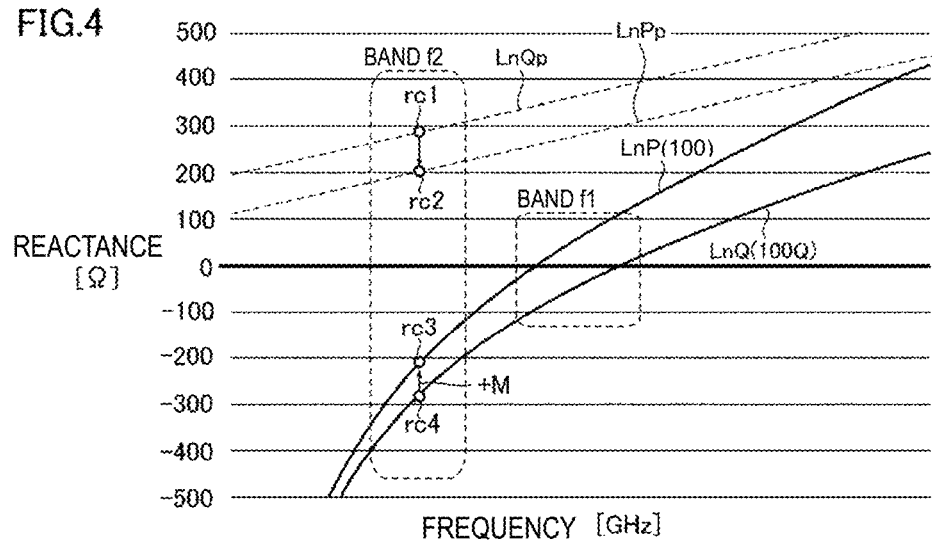
FIG. 4 is a diagram for explaining inductive reactance necessary for resonance of an LC parallel resonator.

FIG. 4 is a diagram for explaining inductive reactance necessary for resonance of the LC parallel resonator RP. A horizontal axis indicates frequencies of high-frequency signals and a vertical axis indicates reactance values. The filter device 100 is an example of the filter device that includes the equivalent circuit illustrated in FIG. 2. As illustrated in FIG. 2, in the filter device 100, additive polarity magnetic coupling is established between the inductor L1 and the inductor L2. On the other hand, a filter device 100Q of a comparative example is a filter device in which magnetic coupling is not established between the inductor L1 and the inductor L2. The filter device 100Q has the same or substantially the same configuration as that of the filter device 100, except that the magnetic coupling is not established between the inductor L1 and the inductor L2.

A line LnP indicates a capacitive reactance of the LC series resonator RS in the filter device 100. A line LnQ indicates a capacitive reactance of the LC series resonator RS in the filter device 100Q. As illustrated in the band f2 in FIG. 4, a capacitive reactance rc3 of the LC series resonator RS in the filter device 100 is higher than a capacitive reactance rc4 of the LC series resonator RS in the filter device 100Q. This is attributed to generation of the mutual inductance M corresponding to a coupling coefficient k by the magnetic coupling between the inductor L1 and the inductor L2.

As indicated with the lines LnP and LnQ in FIG. 4, both of capacitive reactance values of the LC series resonators RS in the filter device 100 and the filter device 100Q are 0 in the band f1. In other words, a high-frequency signal at a frequency that belongs to the band f1 passes through the LC series resonators RS in the filter device 100 and the filter device 100Q. Thus, the filter device 100 and the filter device 100Q can pass the high-frequency signal in the band f1 being the pass band through the filter device 100 and the filter device 100Q.

A dashed line LnQp indicates an inductive reactance of the inductor L1 in the filter device 100Q. In the filter device 100Q, a value of the inductive reactance of the inductor L1 needs to be an inductive reactance rc1 illustrated in FIG. 4 in order to cause the LC parallel resonator RP to resonate in the band f2. In other words, an absolute value of the inductive reactance rc1 is the same or substantially the same value as an absolute value of the capacitive reactance rc4.

A dashed line LnPp indicates an inductive reactance of the inductor L1 in the filter device 100. In the filter device 100, a value of the inductive reactance of the inductor L1 needs to be an inductive reactance rc2 illustrated in FIG. 4 in order to cause the LC parallel resonator RP to resonate in the band f2. In other words, an absolute value of the inductive reactance rc2 is the same or substantially the same value as an absolute value of the capacitive reactance rc3. As described above, the inductive reactance rc2 required to cause the LC parallel resonator RP in the filter device 100 to resonate is smaller than the inductive reactance rc1. This is attributed to a fact that the capacitive reactance rc3 is higher than the capacitive reactance rc4 as a consequence of generation of the mutual inductance M.

Moreover, in the filter device 100, the value of the inductor L1 is reduced regarding the inductive reactance rc2 itself because the mutual inductance M is added to the inductance of the inductor L1. As described above, in the filter device 100, it is possible to reduce the inductance of the inductor L1 as compared to the filter device 100Q by causing the inductor L1 and the inductor L2 to establish the additive polarity magnetic coupling. Accordingly, it is possible to narrow the attenuation band as described with reference to FIG. 2, and thus to improve steepness of the attenuation band of the filter device 100. Here, in the filter device 100, subtractive polarity magnetic coupling may be established instead of the additive polarity magnetic coupling on the condition that the inductance of the inductor L1 is smaller than the inductance of the inductor L2.

Simulation Results

Figure 5:
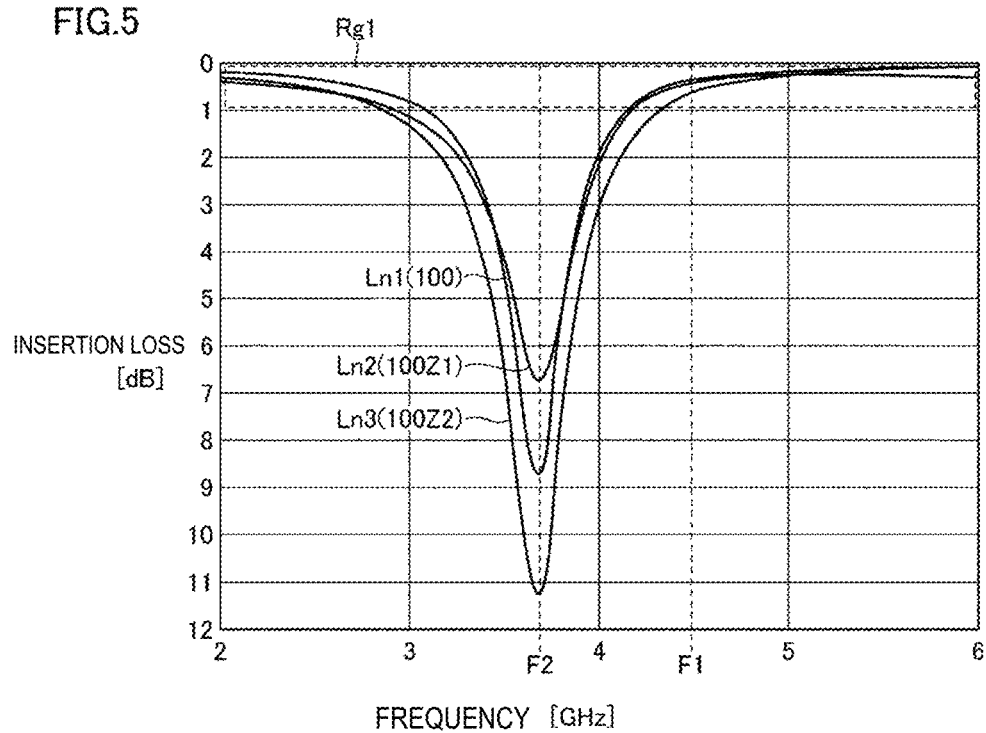
FIG. 5 is a diagram illustrating examples of an insertion loss of the filter device of Preferred Embodiment 1 of the present invention and insertion losses of filter devices of comparative examples.

FIG. 5 is a diagram illustrating examples of an insertion loss of the filter device 100 of Preferred Embodiment 1 and insertion losses of filter devices 100Z1 and 100Z2 of comparative examples. FIG. 5 illustrates lines Ln1 to Ln3 that indicate the insertion losses of the filter device 100 of Preferred Embodiment 1 and the filter devices 100Z1 and 100Z2 of the comparative examples. A horizontal axis indicates frequencies of high-frequency signals and a vertical axis indicates insertion losses of the high-frequency signals. Here, an insertion loss is a ratio of electric power outputted from the filter device 100 to electric power inputted thereto. The high-frequency signal is less likely to pass through the filter device when the insertion loss is large, and the high-frequency signal is more likely to pass through the filter device when the insertion loss is small.

A line Ln1 indicates a waveform of the insertion loss of the filter device 100 of Preferred Embodiment 1. A line Ln2 indicates a waveform of the insertion loss of the filter device 100Z1 of the comparative example. A line Ln3 indicates a waveform of the insertion loss of the filter device 100Z2 of the other comparative example.

Differences among the filter device 100, the filter device 100Z1, and the filter device 100Z2 in FIG. 5 will be described below. Each of the filter device 100, the filter device 100Z1, and the filter device 100Z2 represents an example of the filter device that has the same or substantially the same configuration as the LC parallel resonator RP illustrated in FIG. 2. However, these filter devices are different in the following ways.

In the filter device 100 of Preferred Embodiment 1, for example, the inductance of the inductor L1 is about 0.775 nH, the inductance of the inductor L2 is about 0.997 nH, the capacitance of the capacitor C1 is about 0.885 pF, and the inductor L1 and the inductor L2 establish the additive polarity magnetic coupling.

In the filter device 100Z1 of the comparative example, the inductance of the inductor L1 is about 1.195 nH, the inductance of the inductor L2 is about 1.417 nH, the capacitance of the capacitor C1 is about 0.885 pF, and the inductor L1 and the inductor L2 establish the subtractive polarity magnetic coupling.

In the filter device 100Z2 of the comparative example, the inductance of the inductor L1 is about 0.997 nH, the inductance of the inductor L2 is 0. about 775 nH, the capacitance of the capacitor C1 is about 0.885 pF, and the inductor L1 and the inductor L2 establish the additive polarity magnetic coupling.

In other words, the filter device 100Z1 of the comparative example is different from the filter device 100 of Preferred Embodiment 1 in that the magnetic coupling between the inductor L1 and the inductor L2 is the subtractive polarity coupling. On the other hand, the filter device 100Z2 of the comparative example is different from the filter device 100 of Preferred Embodiment 1 in that the inductance of the inductor L1 is larger than the inductance of the inductor L2.

The inductances of the inductors L1 and L2 and the capacitance of the capacitor C1 in the filter device 100 of Preferred Embodiment 1 are not limited to the above-described values. The inductance values of the inductors L1 and L2 and the capacitance values of the capacitors C1 in the respective filter devices include stray capacitances and stray inductances.

A frequency that causes attenuation of the respective lines Ln1 to Ln3 is a frequency F2. Specifically, the frequency F2 is a resonant frequency of the LC parallel resonator RP. Moreover, the frequency F2 is a frequency that belongs to the band f2 being the attenuation band. Accordingly, at the frequency F2 of the band f2, insertion loss is largest in each of the filter devices 100, 100Z1, and 100Z2 as illustrated in FIG. 5. On the other hand, a frequency F1 is a frequency that belongs to the band f1 being the pass band. The insertion losses at the frequency that belongs to the band f1 in the filter devices 100, 100Z1, and 100Z2 will be described below with reference to FIG. 6. In the following, the frequency F2 will be treated as any frequency that belongs to the band f2 while the frequency F1 will be treated as any frequency that belongs to the band f1. In other words, the frequency F2 only needs to be a frequency that belongs to the band f2 and the frequency F1 only needs to be a frequency that belongs to the band f1.

Figure 6:
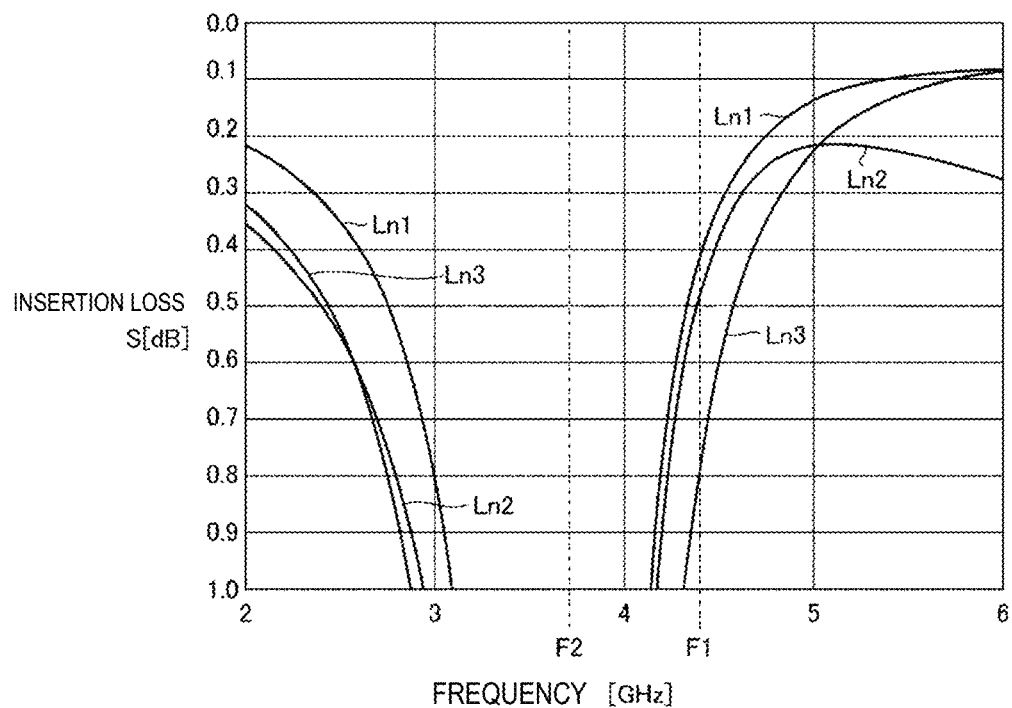
FIG. 6 is a vertical-axis enlarged diagram of a region illustrated in FIG. 5.

FIG. 6 is a vertical-axis enlarged diagram of a region Rg1 indicated in FIG. 5. FIG. 6 illustrates enlarged waveforms in the region Rg1 indicated in FIG. 5, which is enlarged in the direction of the vertical axis (the insertion loss). In order to clarify differences among the respective lines Ln1 to Ln3, a ratio in the direction of the horizontal axis (the frequency) in FIG. 6 is the same or substantially the same as that in FIG. 5. Accordingly, only a ratio in the vertical axis (the insertion loss) is enlarged.

As illustrated in FIG. 6, the insertion losses in the case of the high-frequency signal at the frequency F1 passing through the respective filter devices are about 0.418 dB in the case of a line LN1, about 0.468 dB in the case of a line LN2, and about 0.773 dB in the case of a line LN3. Among the filter device 100 of Preferred Embodiment 1 and the filter devices 100Z1 and 100Z2 of the comparative examples, the insertion loss of the filter device 100 of Preferred Embodiment 1 is smallest. In other words, in the filter device 100 of Preferred Embodiment 1, the band f2 is the attenuation band as in the filter devices 100Z1 and 100Z2, and meanwhile, the high-frequency signal at the frequency F1, which belongs to the band f1 being the pass band, is likely to pass most through the filter device 100 as compared to the filter devices 100Z1 and 100Z2.

As described above, in the filter device 100 of Preferred Embodiment 1, the inductance of the inductor L1 is smaller than the inductance of the inductor L2. Accordingly, it is possible to improve steepness of the attenuation band and to make the insertion loss in the band f1, which is the pass band located close to the band f2 being the attenuation band, smaller than those in the comparative examples. In other words, the filter device 100 of Preferred Embodiment 1 can reduce or prevent the loss generated in the case of passing the high-frequency signal of the band f1 through the filter device 100.

Moreover, the filter device 100 of Preferred Embodiment 1 can further reduce the inductance of the inductor L1 by the additive polarity coupling established between the inductor L1 and the inductor L2. Thus, it is possible to further improve steepness of the attenuation band.

Regarding Characteristic Impedances of Transmission Lines

Figure 7:
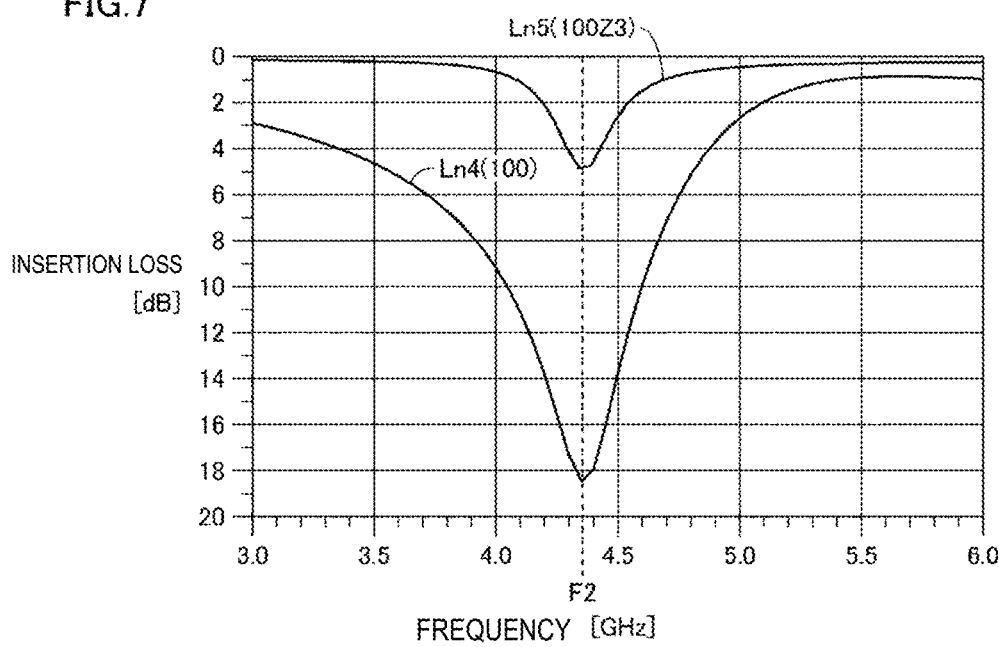
FIG. 7 is a diagram illustrating examples of an insertion loss of the filter device of Preferred Embodiment 1 of the present invention and an insertion loss of a filter device of a comparative example.

Next, an example of adjusting the insertion loss of the filter device 100 by adjusting characteristic impedances of the transmission lines will be described. FIG. 7 is a diagram illustrating examples of the insertion loss of the filter device 100 of Preferred Embodiment 1 and an insertion loss of a filter device 100Z3 of a comparative example.

As illustrated in FIG. 1, a characteristic impedance of the transmission line TL1 is, for example, about 50Ω. Meanwhile, a characteristic impedance of each of the transmission line TL2 and the transmission line TL3 is, for example, about 5Ω. FIG. 7 illustrates lines Ln4 and Ln5 that indicate insertion losses of the filter device 100 according to Preferred Embodiment 1 and the filter device of the comparative example. A horizontal axis indicates frequencies of high-frequency signals and a vertical axis indicates insertion losses of the high-frequency signals. In FIG. 7, the LC parallel resonators RP of the filter device 100 and the filter device 100Z3 are adjusted such that the resonant frequency F2 thereof is, for example, about 4.35 GHz.

The line Ln4 indicates a waveform of the insertion loss of the filter device 100 of Preferred Embodiment 1. The line Ln5 indicates a waveform of the insertion loss of the filter device 10023 of the comparative example. While the filter device 100 and the filter device 100Z3 are the filter devices having the same or substantially the same configuration, the filter device 100Z3 is connected to the transmission line TL2 at about 50Ω and to the transmission line TL3 at about 50Ω. On the other hand, as illustrated in FIG. 1, for example, the filter device 100 is connected between the transmission line TL2 at about 5Ω and the transmission line TL3 at about 5Ω.

As described above, in the filter device 100 of Preferred Embodiment 1, a ratio between the characteristic impedance of the transmission lines and the characteristic impedance of the filter device 100 is increased by connecting the filter device 100 to the transmission lines TL1 and TL2 having the characteristic impedances lower than about 50Ω, for example, so that the insertion loss can be increased. Accordingly, the insertion loss is increased as illustrated in FIG. 7 and the attenuation band including the frequency F2 is improved. Here, the characteristic impedances of the transmission line TL2 and the transmission line TL3 may be set to other values as long as the values are less than about 50Ω.

Example of Circuit Configuration

Figure 8:
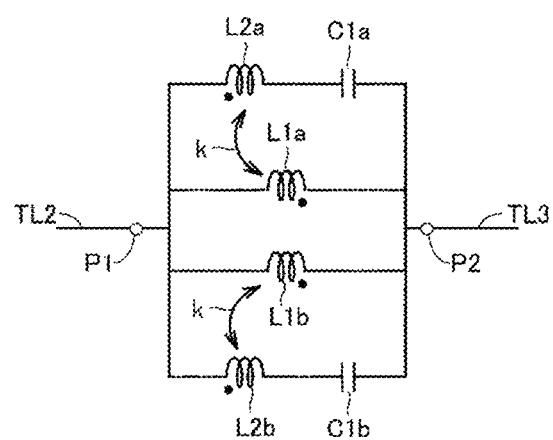
FIG. 8 is a diagram illustrating a circuit configuration in which the LC parallel resonator is connected in parallel.
Figure 9:
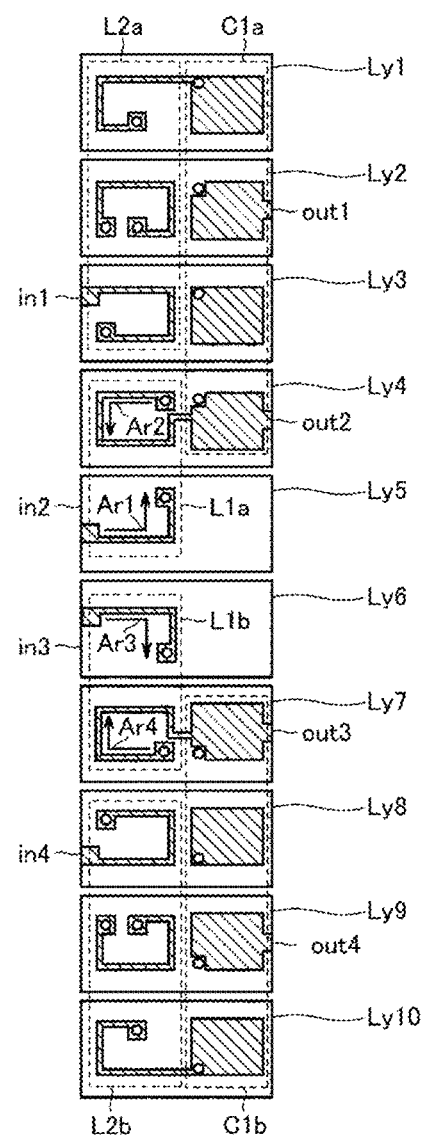
FIG. 9 is an exploded diagram of a filter device that includes the circuit configuration illustrated in FIG. 8.

Next, an example of structuring the filter device 100 of Preferred Embodiment 1 as an integrated element will be described with reference to FIG. 8 and FIG. 9. FIG. 8 is a diagram illustrating a circuit configuration in which the LC parallel resonator RP is connected in parallel. FIG. 9 is an exploded diagram of the filter device 100 that is structured as the integrated element.

FIG. 8 illustrates the filter device 100 having such a circuit configuration that achieves the equivalent circuit illustrated in FIG. 2 by connecting the LC parallel resonators RP illustrated in FIG. 2 in parallel. An inductor Lia and an inductor Lib in FIG. 8 define and function as the inductor L1 in FIG. 2. An inductor L2a and an inductor L2b in FIG. 8 define and function as the inductor L2 in FIG. 2. A capacitor C1a and a capacitor Cib in FIG. 8 define and function as the capacitor C1 in FIG. 2. The inductor L2a and the inductor Lia establish additive polarity magnetic coupling. The inductor L2b and the inductor Lib establish additive polarity magnetic coupling.

In other words, in the case where the equivalent circuit illustrated in FIG. 2 is provided by the circuit configuration illustrated in FIG. 8, the inductor L1 illustrated in FIG. 2 includes the inductor Lia (a third inductor) and the inductor Lib (a fourth inductor) provided in a multilayer body. The inductor L2 illustrated in FIG. 2 includes the inductor L2a (a fifth inductor) and the inductor L2b (a sixth inductor) provided in the multilayer body. Moreover, the capacitor C1 illustrated in FIG. 2 includes the capacitor C1a and the capacitor Cib provided in the multilayer body. As described above, the inductance of the inductor L1 can be further reduced by connecting the LC parallel resonators RP illustrated in FIG. 2 in parallel. The further reduction in inductance of the inductor L1 will be described below by using FIG. 9.

As illustrated in FIG. 9, the filter device 100 is formed by laminating ten dielectric layers Ly1 to Ly10. In other words, the filter device 100 includes a multilayer body in which the dielectric layers Ly1 to Ly10 are laminated. FIG. 9 illustrates a state in plan view of the respective dielectric layers Ly1 to Ly10. In each dielectric layer, a hatched region indicates an electrode that transmits a high-frequency signal, and a circular shape indicates an end portion of a via hole that connects the respective dielectric layers.

The dielectric layers Ly3, Ly5, Ly6, and Ly8 are provided with terminals in in2, in3, and in4, respectively. Each of the terminals in in2, in3, and in4 is connected to the terminal P1 in FIG. 8. The dielectric layers Ly2, Ly4, Ly7, and Ly9 are provided with terminals out1, out2, out3, and out4, respectively. Each of the terminals out1, out2, out3, and out4 is connected to the terminal P2 in FIG. 8.

As illustrated in FIG. 9, electrodes in a winding wire shape included in the dielectric layer Ly1, the dielectric layer Ly2, and the dielectric layer Ly3 define the inductor L2a. Electrodes in a flat plate shape included in the dielectric layer Ly1, the dielectric layer Ly2, the dielectric layer Ly3, and the dielectric layer Ly4 define the capacitor C1a. Electrodes in a winding wire shape included in the dielectric layer Ly4 and the dielectric layer Ly5 define the inductor Lia.

Electrodes in a winding wire shape included in the dielectric layer Ly6 and the dielectric layer Ly7 define the inductor Lib. Electrodes in a winding wire shape included in the dielectric layer Ly8, the dielectric layer Ly9, and the dielectric layer Ly10 define the inductor L2b. Electrodes in a flat plate shape included in the dielectric layer Ly7, the dielectric layer Ly8, the dielectric layer Ly9, and the dielectric layer Ly10 define the capacitor C1b. Accordingly, the multilayer body provided to the filter device 100 illustrated in FIG. 9 achieves the circuit configuration illustrated in FIG. 8.

As described with reference to FIG. 3, steepness of the attenuation band is improved by reducing the inductance of the inductor L1. Moreover, as described with reference to FIG. 4, the inductor L1 and the inductor L2 establish the additive polarity magnetic coupling. Accordingly, the mutual inductance M is generated and the inductance of the inductor L1 is reduced further.

The mutual inductance M attributed to the additive polarity magnetic coupling between the inductor L1a and the inductor L2a is increased by enlarging opening surfaces (cross-sectional areas) of the inductor L1a and the inductor L2a illustrated in FIG. 9. However, the increase in cross-sectional area of the inductor L1a also increases the inductance of the inductor L1a. For this reason, the inductor L1a and the inductor L1b are disposed in parallel as illustrated in FIG. 9. To be more precise, the inductor L1a is defined by the electrodes of the dielectric layers Ly4 and Ly5 while the inductor L1b is defined by the electrodes of the dielectric layers Ly6 and Ly7 which are adjacent to the dielectric layers Ly4 and Ly5. Accordingly, in the filter device 100 illustrated in FIG. 9, it is possible to increase the mutual inductance M attributed to the additive polarity magnetic coupling between the inductor L1a and the inductor L2a without increasing the inductance synthesized by the inductor L1a and the inductor L1b.

Next, attention is focused on the magnetic coupling between the inductor L1a and the inductor L1b. The inductances of the inductor L1a and the inductor L1b may be increased by the magnetic coupling established between the inductor L1a and the inductor L1b.

The filter device 100 in FIG. 9 is configured such that a winding direction of the inductor L1a and a winding direction of the inductor L1b are different from each other. To be more precise, as indicated with an arrow Ar1, the electrode in the winding wire shape of the dielectric layer Ly5 is wound counterclockwise from the terminal in2. Thereafter, the electrode in the winding wire shape of the dielectric layer Ly5 is connected to the electrode in the winding wire shape of the dielectric layer Ly4 via the via hole. As indicated with an arrow Ar2, the electrode in the winding wire shape of the dielectric layer Ly4 is wound further counterclockwise from an end portion of the via hole. In other words, as indicated with the arrow Ar1 and the arrow Ar2, the winding direction of the inductor L1a in plan view of the multilayer body is counterclockwise (turned to the left).

In the meantime, as indicated with an arrow Ar3, the electrode in the winding wire shape of the dielectric layer Ly6 is wound clockwise from the terminal in3. Thereafter, the electrode in the winding wire shape of the dielectric layer Ly6 is connected to the electrode in the winding wire shape of the dielectric layer Ly7 via the via hole. As indicated with an arrow Ar4, the electrode in the winding wire shape of the dielectric layer Ly7 is wound further clockwise from an end portion of the via hole. In other words, as indicated with the arrow Ar3 and the arrow Ar4, the winding direction of the inductor L1b in plan view of the multilayer body is clockwise (turned to the right).

As described above, in the filter device 100 illustrated in FIG. 9, the winding direction of the inductor L1a is opposite to the winding direction of the inductor L1b, thus reducing overlap of the inductor L1a and the inductor L1b in plan view. Accordingly, in the filter device 100 illustrated in FIG. 9, it is possible to provide the inductor L1a and the inductor L1b at the adjacent dielectric layers while reducing the magnetic coupling between the inductor L1a and the inductor L1b and preventing the increase in inductance of the inductor L1a and the inductor L1b.

Moreover, an area of overlap of the winding wire that defines the inductor L2a in the dielectric layer Ly3 and the winding wire that defines the inductor L1a in the dielectric layer Ly4 is larger than an area of overlap of the winding wire that defines the inductor L1a in the dielectric layer Ly5 and the winding wire that defines the inductor L2a in the dielectric layer Ly3 in plan view. In this way, it is possible to increase a coupling coefficient of the magnetic coupling between the inductor L2a and the inductor L1a and to further reduce the inductance of the inductor L1a. Similarly, it is possible to increase a coupling coefficient of the magnetic coupling between the inductor L2b and the inductor L1b and to further reduce the inductance of the inductor L1b.

In the dielectric layers Ly1 to Ly10, the inductors L1a, L1b, L2a, and L2b are disposed in such a way as not to overlap the capacitors C1a and C1b in plan view of the dielectric layers Ly1 to Ly10 as illustrated in FIG. 9. In this way, it is possible to increase the coupling coefficient without blocking a magnetic flux generated by the magnetic coupling between the inductor L1a and the inductor L2a and a magnetic flux generated by the magnetic coupling between the inductor L1b and the inductor L2b, thus preventing the increase in inductance of L1a and L1b.

Here, the filter device 100 of Preferred Embodiment 1 may be configured to include either a set of the dielectric layers Ly1 to Ly5 or a set of the dielectric layers Ly6 to Ly10 of the multilayer body illustrated in FIG. 9.

Preferred Embodiment 2

The antenna device 150 provided with the antenna 155 has been described in the above-described Preferred Embodiment 1. In Preferred Embodiment 2 of the present invention, an antenna module 200 that includes an antenna device 160 in addition to the antenna device 150 of Preferred Embodiment 1 will be described. Explanations of a configuration of the antenna module 200 of Preferred Embodiment 2 which overlaps the configuration of the antenna device 150 of Preferred Embodiment 1 will not be repeated.

Basic Configuration of Antenna Module

Figure 10:
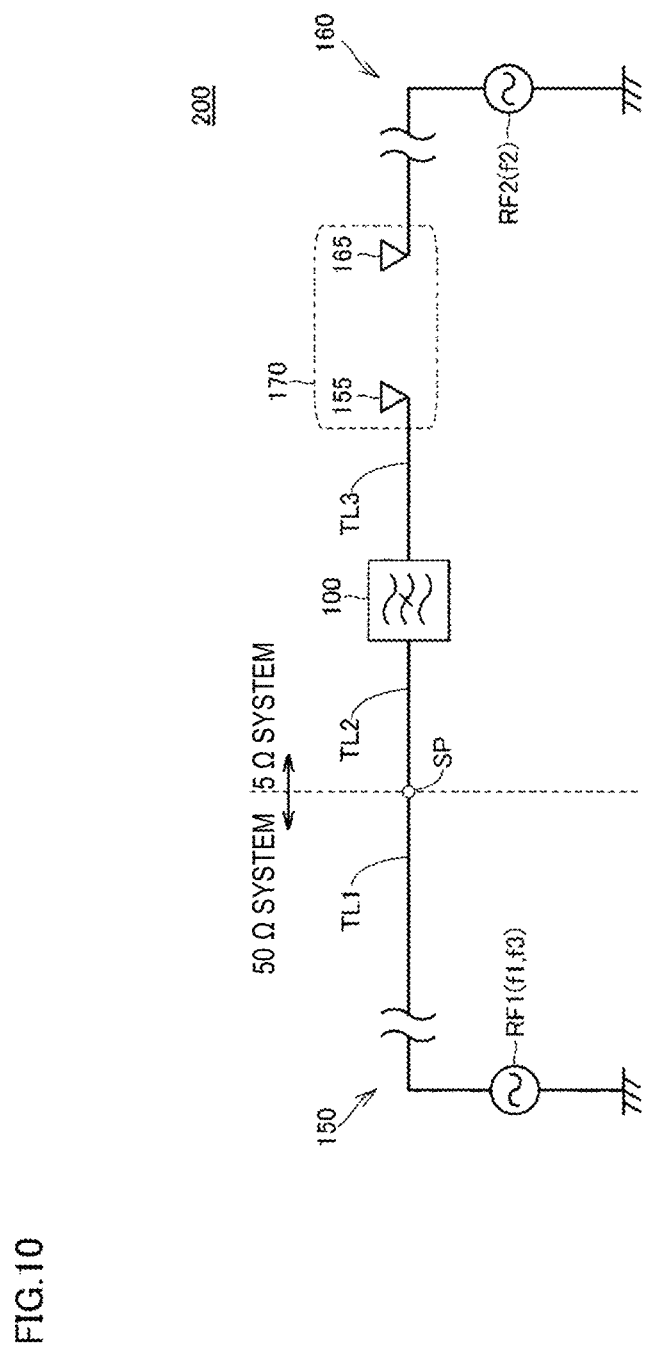
FIG. 10 is a diagram illustrating a configuration of an antenna module according to Preferred Embodiment 2 of the present invention.

FIG. 10 is a diagram illustrating a configuration of the antenna module 200 of Preferred Embodiment 2. The antenna module 200 includes the antenna device 150 and the antenna device 160. The antenna device 160 includes a power supply circuit RF2 and an antenna 165. The antenna module 200 is mounted on, for example, a portable terminal such as a cellular phone, a smartphone, and a tablet, or on a communication device such as a personal computer provided with a communication function.

The power supply circuit RF1 supplies high-frequency signals in frequency bands of a band f1 and a band f3 to the antenna 155. The antenna 155 can emit the high-frequency signals of the band f1 and the band f3 supplied from the power supply circuit RF1 into the air as radio waves. The frequency band of the band f1 is the 5 GHz band (about 5.15 GHz to about 5.7 GHz) of Wi-Fi, for example. The frequency band of the band f3 is a 2 GHz band (about 2.4 GHz to about 2.48 GHz) of Wi-Fi, for example.

The filter device 100 of Preferred Embodiment 2 is configured to cause a high-frequency signal in a frequency band of a band f2 to be attenuated. For example, the frequency band of the band f2 is a band that includes n77 (about 3.3 GHz to about 4.2 GHz) of 5G-NR and the like. The band f2 is not limited to n77 (about 3.3 GHz to about 4.2 GHz) but may be, for example, a band that includes n78 (about 3.3 GHz to about 3.8 GHz) and n79 (about 4.4 GHz to about 4.9 GHz) in addition to n77.

Regarding the filter device 100 of Preferred Embodiment 2, the band f1 and the band f3 are the pass bands while the band f2 is the attenuation band. The band f2 is the frequency band located between the band f1 and the band f3. The frequency band of the band f2 is lower than the frequency band of the band f1. The frequency band of the band f3 is lower than the frequency band of the band f2.

In other words, among the band f1, the band f2, and the band f3, the band f1 is the highest frequency band and the band f3 is the lowest frequency band. Each of the band f1, the band f2, and the band f3 may be a different frequency band as long as a relationship among the band f1, the band f2, and the band f3 is a relationship in which the frequency band lowers in the order of the band f1, the band f2, and the band f3. The resonant frequency F2 of the LC parallel resonator RP of the filter device 100 of Preferred Embodiment 2 is adjusted to be, for example, about 3.8 GHz, which is around a median value of the band f2 in Preferred Embodiment 2.

The power supply circuit RF2 supplies a high-frequency signal in the frequency band of the band f2 to the antenna 165. The antenna 165 can emit the high-frequency signal of the band f2 supplied from the power supply circuit RF2 into the air as a radio wave.

In the antenna device 150, the high-frequency signal of the band f2 emitted from the antenna device 160 provided in the same antenna module 200 may become noise. Accordingly, the filter device 100 is provided in order to remove the high-frequency signal of the band f2, which may be the noise in the antenna device 150, by increasing an insertion loss attributed to parallel resonance.

The antenna 155 and the antenna 165 are mounted on a common substrate 170. Although the antenna 155 and the antenna 165 are provided to the same substrate 170 in FIG. 10, the antenna 155 and the antenna 165 may be provided to different substrates as long as the antenna 155 and the antenna 165 are provided in the same antenna module 200. In Preferred Embodiment 2, the power supply circuit RF1 may supply only the high-frequency signal of the band f1 without supplying the high-frequency signal of the band f3.

Figure 11:
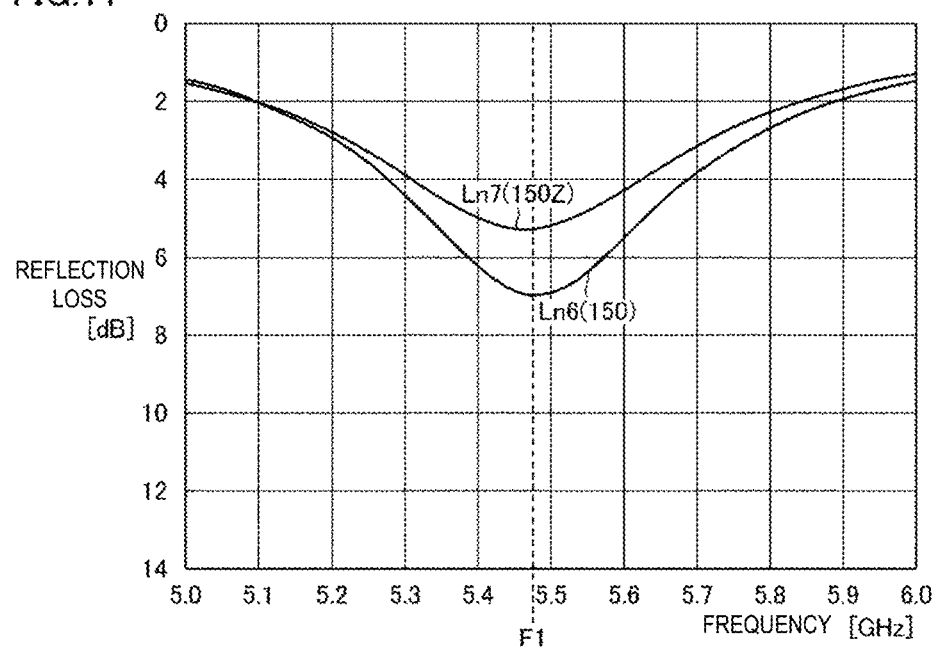
FIG. 11 is a diagram illustrating examples of a return loss of an antenna device according to Preferred Embodiment 2 of the present invention and a return loss of an antenna device of a comparative example.

FIG. 11 is a diagram illustrating examples of a return loss of the antenna device 150 of Preferred Embodiment 2 and a return loss of an antenna device 150Z of a comparative example. A horizontal axis indicates frequencies of high-frequency signals and a vertical axis indicates return losses of the high-frequency signals. Here, the return loss is a ratio of returned electric power to electric power supplied from the power supply circuit RF1 of the antenna device 150. In other words, the return loss increases as the electric power is emitted from the antenna.

A line Ln6 indicates a waveform of the return loss of the antenna device 150 of Preferred Embodiment 2. A line Ln7 indicates a waveform of the return loss of the antenna device 150Z of the comparative example. The antenna device 150Z has a configuration in which the filter device 100 is removed from the antenna device 150 illustrated in FIG. 10. In other words, the antenna device 150 of Preferred Embodiment 2 and the antenna device 150Z of the comparative example are different in whether or not the filter device 100 is provided.

As illustrated in FIG. 11, at the frequency F1 included in the band f1 of the pass band, the return loss of the antenna device 150 of Preferred Embodiment 2 provided with the filter device 100 is larger as compared to that of the antenna device 150Z of the comparative example. In other words, providing the filter device 100 improves antenna characteristics of the antenna device 150 more than those of the antenna device 150Z of the comparative example. Both the line Ln7 and the line Ln6 attenuate at the frequency F1. Specifically, no deviation in impedance frequency occurs between the antenna device 150 and the antenna device 150Z due to series resonance in the filter device 100, so that matching can be maintained. In other words, the impedance matching is not deteriorated depending on whether or not the filter device 100 is provided. Accordingly, in the antenna module 200 of Preferred Embodiment 2, the filter device 100 can be mounted on the antenna device 150 without further impedance matching in case of deterioration of impedance.

Figure 12:
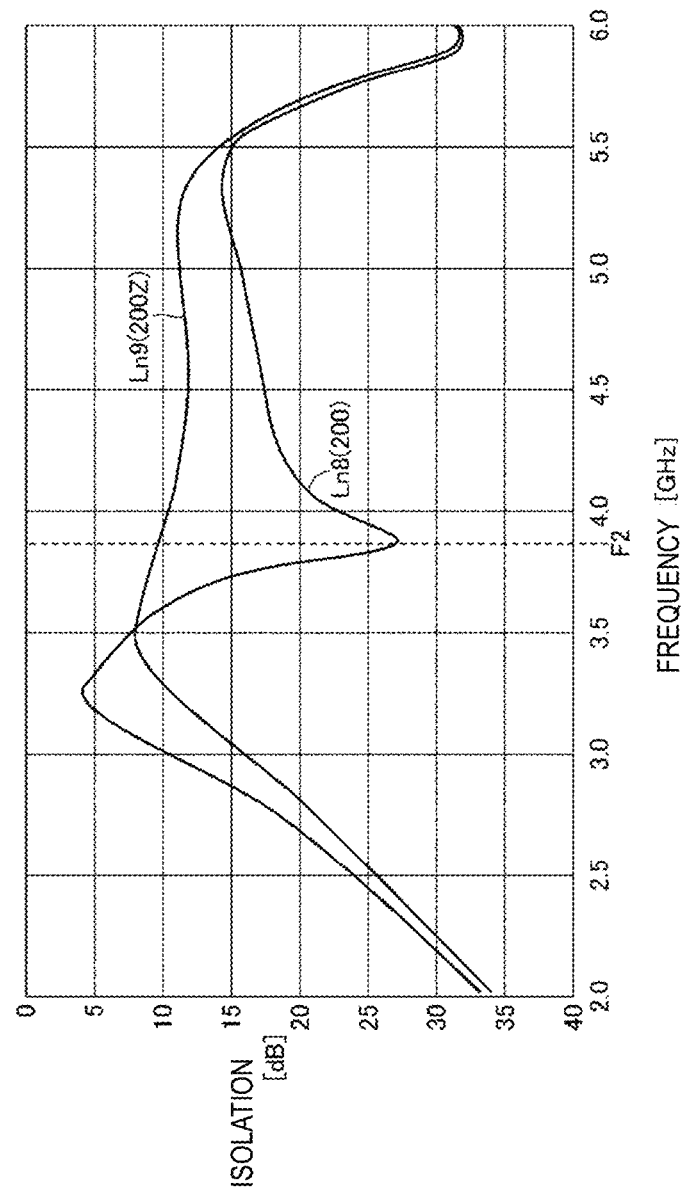
FIG. 12 is a diagram illustrating isolation characteristics between an antenna device and another antenna device.

FIG. 12 is a diagram illustrating isolation characteristics between the antenna device 150 and the antenna device 160. A horizontal axis indicates frequencies of high-frequency signals and a vertical axis indicates isolation of the high-frequency signals. In other words, the isolation is a ratio of electric power received by the power supply circuit RF2 of the antenna device 160 via the antenna to electric power inputted from the power supply circuit RF1 of the antenna device 150.

A line Ln8 indicates isolation between the antenna device 150 and the antenna device 160 of the antenna module 200 of Preferred Embodiment 2. A line Ln9 indicates isolation between the antenna device 150 and the antenna device 160 of an antenna module 200Z of a comparative example.

The antenna module 200Z has a configuration in which the filter device 100 is removed from the antenna module 200 illustrated in FIG. 10. In other words, the antenna module 200 of Preferred Embodiment 2 and the antenna module 200Z of the comparative example are different in whether or not the filter device 100 is provided.

As illustrated in FIG. 12, for example, at the frequency F2 of the band f2, the isolation of the antenna module 200 of Preferred Embodiment 2 is larger by about 15 dB or more than that of the antenna module 200Z of the comparative example. In other words, in Preferred Embodiment 2, the isolation between the antenna device 150 and the antenna device 160 is improved more than that of the comparative example because the filter device 100 attenuates the frequency of the band f2.

Figure 13:
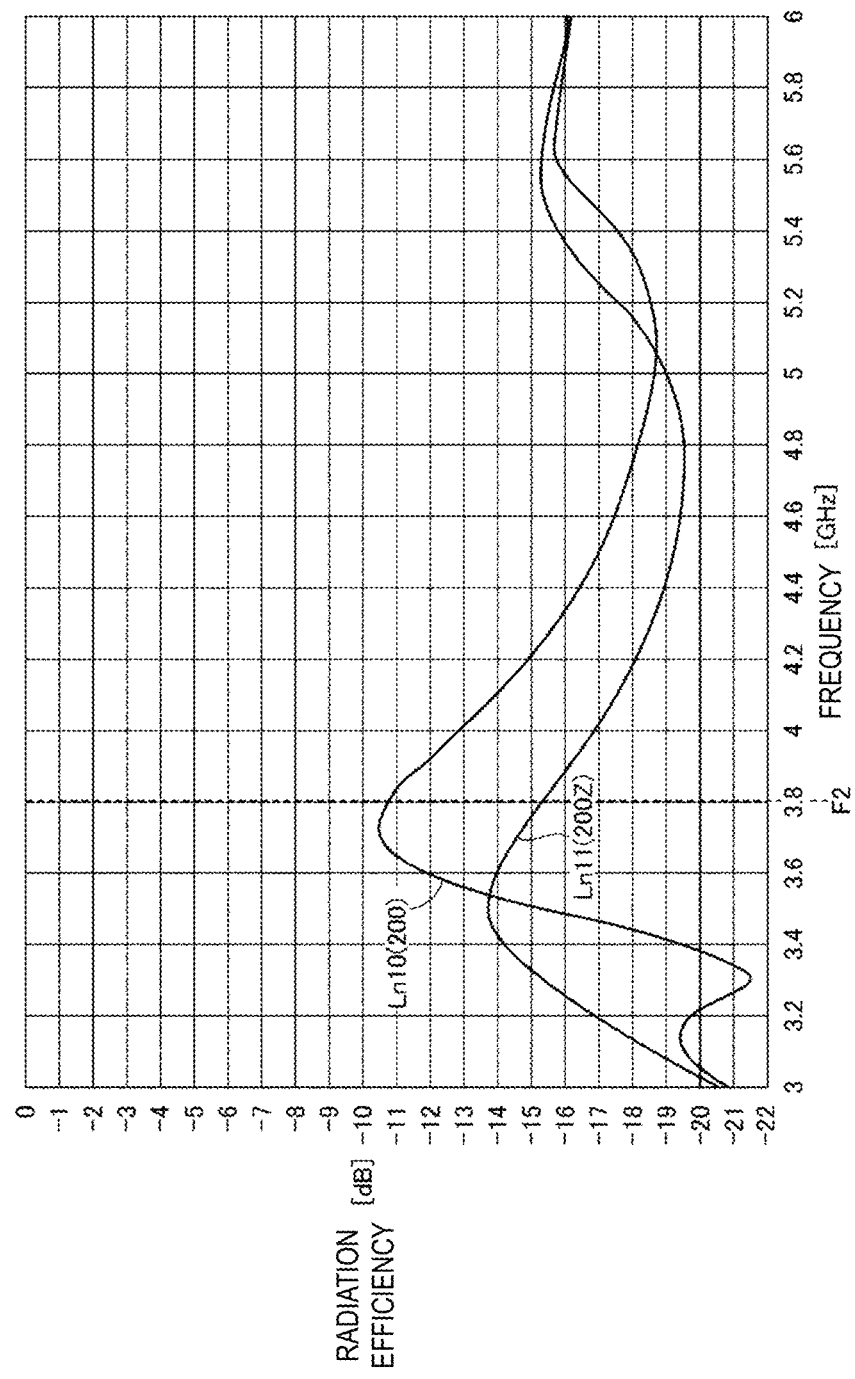
FIG. 13 is a diagram illustrating radiation efficiency of antenna devices.

FIG. 13 is a diagram illustrating radiation efficiency of the antenna devices 160. A horizontal axis indicates frequencies of high-frequency signals and a vertical axis indicates radiation efficiency of the antenna devices 160. A line Ln10 indicates radiation efficiency of the antenna device 160 of the antenna module 200 of Preferred Embodiment 2. A line Ln11 indicates radiation efficiency of the antenna device 160 of the antenna module 200Z of the comparative example. Here, the radiation efficiency indicates a ratio of electric power emitted from the antenna to electric power supplied from the power supply circuit. That is, at an upper portion of the graph in FIG. 13, the electric power emitted from the antenna is larger with respect to the same electric power.

As illustrated in FIG. 13, for example, at the frequency F2 included in the band f2, the radiation efficiency of the antenna module 200 of Preferred Embodiment 2 is improved by about 4.5 dB more than that of the antenna module 200Z of the comparative example. In other words, in Preferred Embodiment 2, it is possible to improve the radiation efficiency of the antenna device 160 more than that of the comparative example by providing the antenna device 150 with the filter device 100.

Comparison with Filter Device 100Z2

Figure 14:
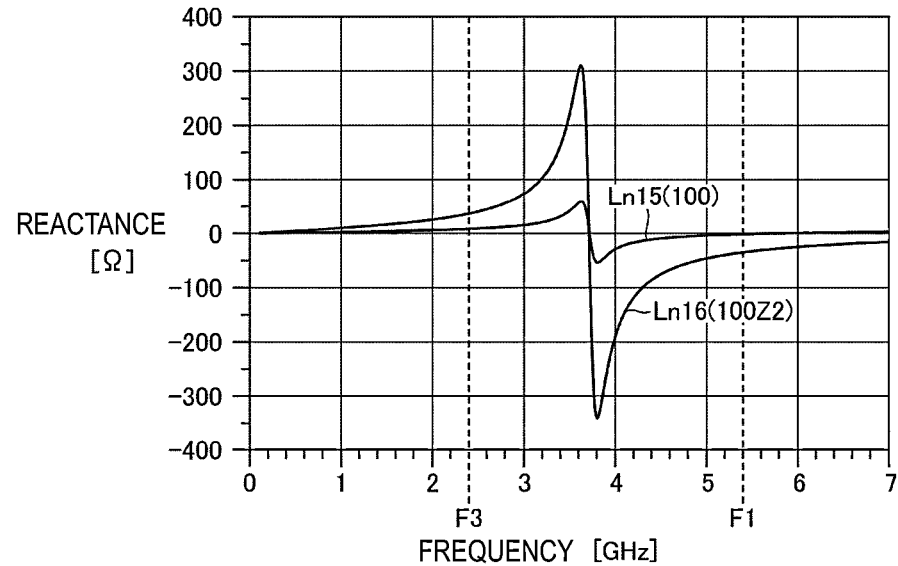
FIG. 14 is a diagram illustrating combined reactance characteristics of an LC parallel resonator according to Preferred Embodiment 2 of the present invention.
Figure 15:
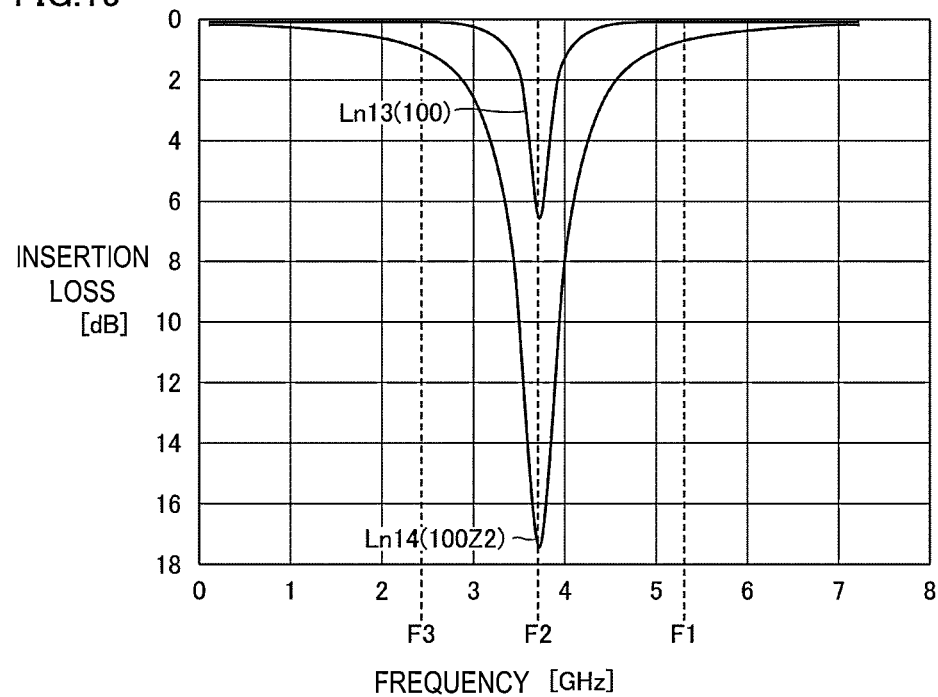
FIG. 15 is a diagram illustrating an insertion loss of a filter device according to Preferred Embodiment 2 of the present invention.
Figure 16:
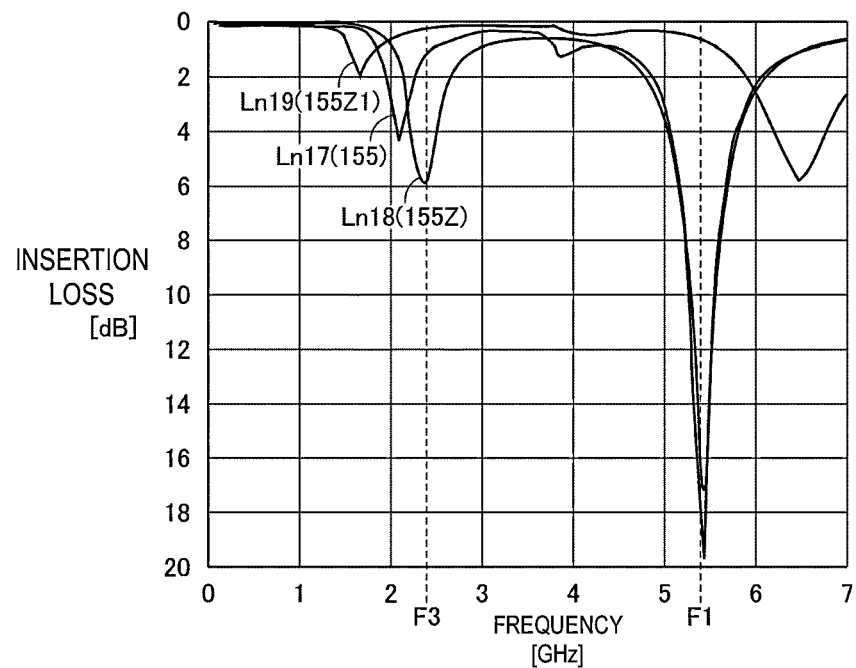
FIG. 16 is a diagram illustrating an insertion loss of an antenna according to Preferred Embodiment 2 of the present invention.

With reference to FIGS. 14 to 16, a description will be provided of a comparison between a case of applying the filter device 100 of Preferred Embodiment 2 to the antenna module 200 and a case of applying the filter device 100Z2 of the above-described comparative example thereto.

The filter device 100Z2 of the comparative example is different from the filter device 100 of Preferred Embodiment 2 in that the inductance of the inductor L1 is larger than the inductance of the inductor L2.

FIG. 14 is a diagram illustrating combined reactance characteristics of the LC parallel resonator RP of Preferred Embodiment 2. In FIG. 14, a horizontal axis indicates frequencies of high-frequency signals and a vertical axis indicates values of the combined reactance of the LC parallel resonators RP.

A line Ln15 indicates the values of the combined reactance of the LC parallel resonator RP of the filter device 100 of Preferred Embodiment 2. A line Ln16 indicates the value of the combined reactance of the LC parallel resonator RP of the filter device 100Z2 in the case of applying the filter device 100Z2 of the comparative example.

As illustrated in FIG. 14, in the filter device 100 in which the inductance of the inductor L1 is smaller than the inductance of the inductor L2, the values of combined reactance at the frequency F1 of the band f1 and at a frequency F3 of the band f3 being the pass bands are smaller than those of the comparative example. Accordingly, the high-frequency signals at the frequencies F1 and F3 included in the pass bands can pass through more easily in the case of the filter device 100 as compared to the filter device 100Z2. In the following description, the frequency F3 will be treated at any frequency that belongs to the band f3. In other words, the frequency F3 only needs to be a frequency that belongs to the band f3.

FIG. 15 is a diagram illustrating an insertion loss of the filter device 100 of Preferred Embodiment 2. A line Ln13 indicates an insertion loss of the filter device 100 of the antenna module 200 of Preferred Embodiment 2. A line Ln14 indicates an insertion loss of the filter device 100Z2 in the case of applying the filter device 100Z2 of the comparative example to Preferred Embodiment 2.

As described with reference to FIG. 14, since the combined reactance is reduced at the frequency F1 of the band f1 and the frequency F3 of the band f3 being the pass bands, the insertion loss of the filter device 100 in Preferred Embodiment 2 is smaller than the insertion loss of the filter device 100Z2 of the comparative example at the frequency F1 and the frequency F3 as illustrated in FIG. 15.

In other words, since the inductance of the inductor L1 is smaller than the inductance of the inductor L2 in the filter device 100 of Preferred Embodiment 2, the high-frequency signals at the frequencies F1 and F3 in the pass bands located close to the attenuation band can pass through the filter device 100 more easily as compared to the comparative example.

In the filter device 100 of Preferred Embodiment 2, the band f2 is defined as the attenuation band by setting the resonant frequency of the LC parallel resonator RP to the frequency F2 included in the band f2. In this instance, the high-frequency signal at the frequency F3 which is lower than the band f2 passes through a route on which the inductor L1 is provided rather than a route of the LC series resonator RS. In other words, the route on which the inductor L1 is provided is dominant in the case of the high-frequency signal of the band f3 passing through the filter device 100.

In Preferred Embodiment 2, the inductance of the inductor L1 is made smaller than the inductance of the inductor L2 in order to generate the attenuation band into a narrow band. Accordingly, the impedance is reduced when high frequency signals at the frequency F3 pass through the inductor L1. As described above, in the antenna module 200 of Preferred Embodiment 2, high frequency signals at the frequency F2 are efficiently emitted from the power supply circuit RF2 and the attenuation band is formed into the narrow band as compared to the filter device 100Z2, thus enabling efficient emission of high frequency signals at the frequencies F1 and F3 from the power supply circuit RF1.

FIG. 16 is a diagram illustrating an insertion loss of the antenna 155 of Preferred Embodiment 2. A line Ln17 indicates the insertion loss of the antenna 155 of the antenna module 200 of Preferred Embodiment 2. A line Ln18 indicates an insertion loss of an antenna 1552 of a comparative example. A line Ln19 indicates an insertion loss of an antenna 15521 of another comparative example.

The antenna 1552 is an antenna in the case of removing the filter device 100 from the antenna device 150 illustrated in FIG. 10. The antenna 15521 has a configuration in which the antenna 155 illustrated in FIG. 10 includes the filter device 10022, instead of the filter device 100.

As illustrated in FIG. 16, in the vicinity of the frequency F3, a frequency on the line Ln17 at which the insertion loss is large is closer to a frequency on the line Ln18 at which the insertion loss is large than to a frequency on the line Ln19 at which the insertion loss is large. In other words, the impedance matching is less deteriorated in the case of mounting the filter device 100 of Preferred Embodiment 2 as compared to the case of mounting the filter device 100Z2. Accordingly, the filter device 100 of Preferred Embodiment 2 has less of an effect on the impedance matching when the filter device 100 is applied to the antenna module 200 as compared to the filter device 100Z2 of the comparative example.

Modified Example of Preferred Embodiment 2

Figure 17:
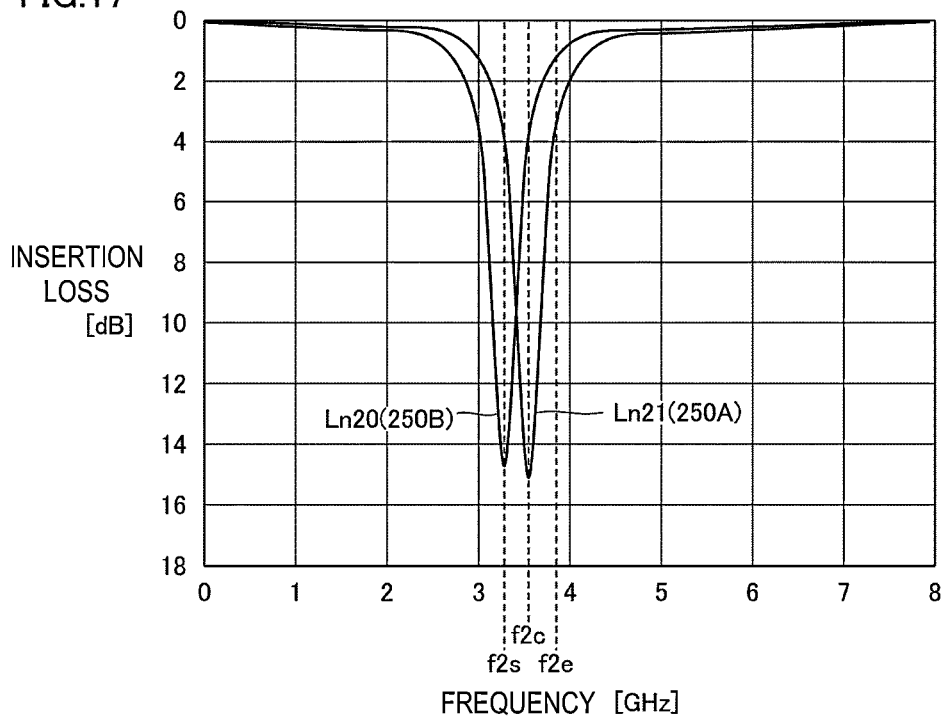
FIG. 17 is a diagram illustrating examples of an insertion loss of an antenna device according to a modified example of Preferred Embodiment 2 of the present invention and an insertion loss of an antenna device of a comparative example.
Figure 18:
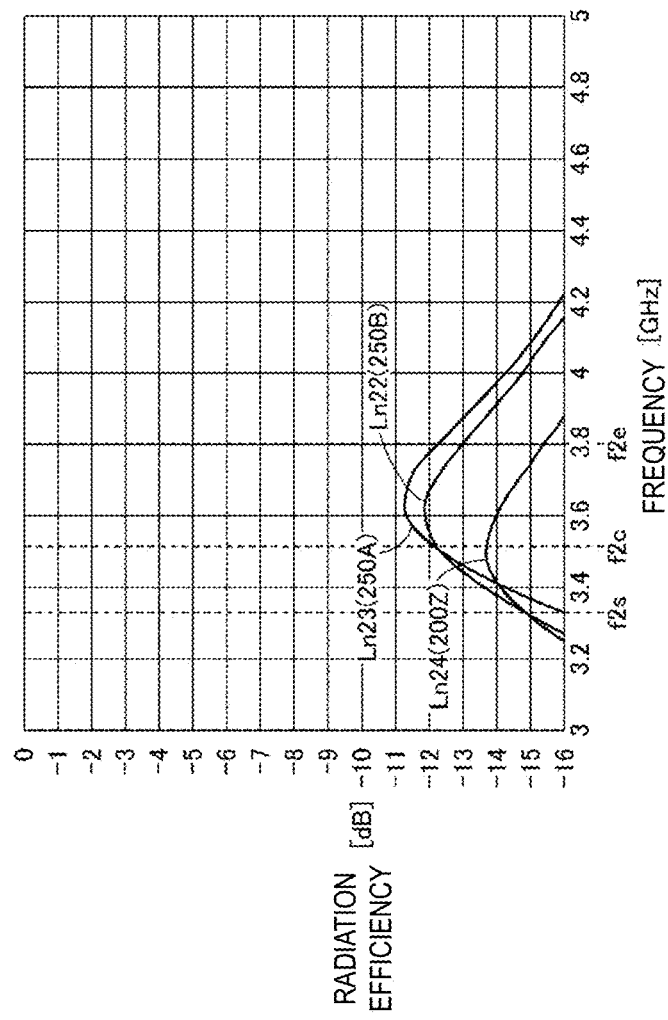
FIG. 18 is a diagram illustrating examples of radiation efficiency of the antenna device of the modified example of Preferred Embodiment 2 of the present invention and radiation efficiency of antenna devices of comparative examples.
Figure 19:
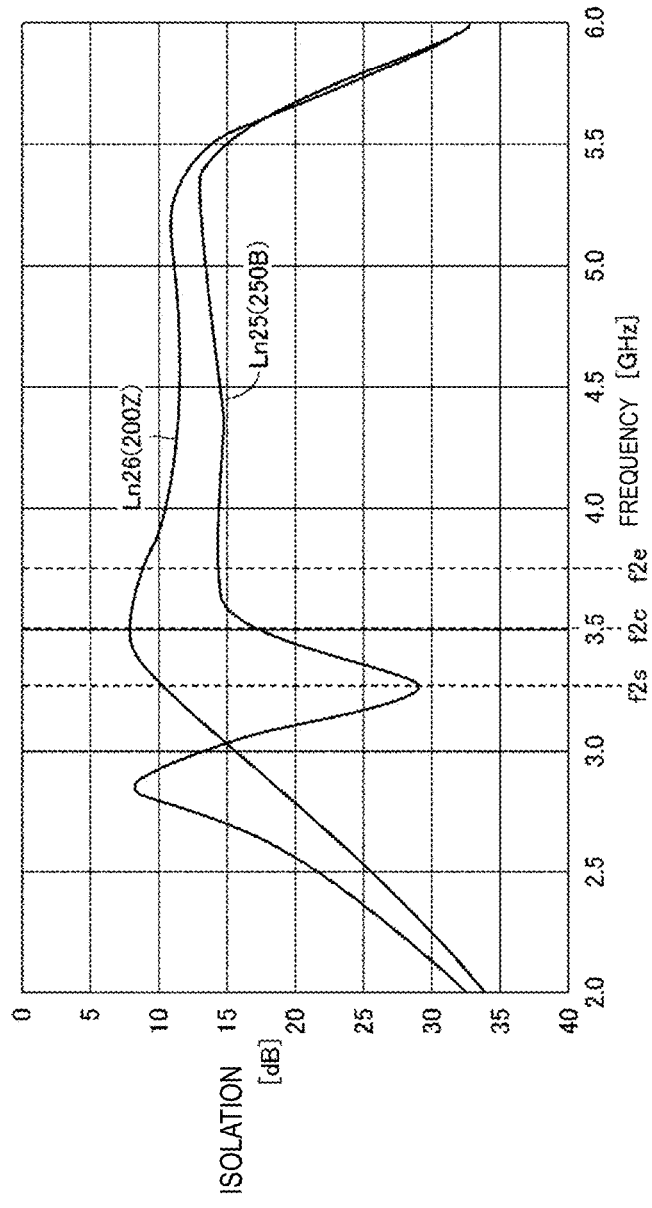
FIG. 19 is a diagram illustrating isolation characteristics between an antenna device and another antenna device according to the modified example of Preferred Embodiment 2 of the present invention.

In Preferred Embodiment 2, a configuration in which the resonant frequency F2 of the LC parallel resonator RP of the filter device 100 is designed to be, for example, about 3.8 GHz in the band f2 has been described. In a modified example of Preferred Embodiment 2, a filter device 100B for which the resonant frequency F2 of the LC parallel resonator RP is designed to be close to a lower limit value of the frequency band of the band f2 will be described. In the modified example of Preferred Embodiment 2, for example, the frequency band of the band f2 is n78 (about 3.3 GHz to about 3.8 GHz) band of 5G-NR. In other words, the resonant frequency F2 of the LC parallel resonator RP of the filter device 100B is about 3.3 GHz, for example. In FIGS. 17 to 19, a comparative example to the filter device 100B will be described by using a filter device 100A. The resonant frequency F2 of the LC parallel resonator RP of the filter device 100A being the comparative example is adjusted to be about 3.5 GHz within the frequency band of the band f2. Regarding the filter device 100B of the modified example of Preferred Embodiment 2, explanations of structures overlapping those of Preferred Embodiment 1 and Preferred Embodiment 2 will not be repeated.

FIG. 17 is a diagram illustrating examples of an insertion loss of the filter device 100B of the modified example of Preferred Embodiment 2 and an insertion loss of the filter device 100A of the comparative example. A frequency f2s that indicates a frequency of about 3.3 GHz near the lower limit value of the band f2, a frequency f2c that indicates a frequency of about 3.5 GHz near the center of the band f2, and a frequency f2e that indicates a frequency of about 3.8 GHz near the upper limit value of the band f2 are illustrated in FIGS. 17 to 19. Antenna modules to which the filter device 100A and the filter device 100B are applied instead of the filter device 100 of Preferred Embodiment 2 will be hereafter referred to as antenna modules 250A and 250B, respectively.

A line Ln20 illustrated in FIG. 17 indicates an insertion loss of the antenna device 150 of the antenna module 250B according to the modified example of Preferred Embodiment 2. A line Ln21 indicates an insertion loss of the antenna device 150 of the antenna module 250A of a comparative example to the modified example of Preferred Embodiment 2. As described above, for example, the resonant frequency F2 of the filter device 100B is designed to be the frequency f2s (about 3.3 GHz) near the lower limit value of n78 band. Here, the resonant frequency of the filter device 100B may be about 3.2 GHz or about 3.4 GHz instead of about 3.3 GHz, for example. On the other hand, the resonant frequency F2 of the filter device 100A is designed to be the frequency f2c (about 3.5 GHz), for example.

FIG. 18 is a diagram illustrating examples of radiation efficiency of the antenna device 150 of the modified example of Preferred Embodiment 2 and radiation efficiency of the antenna devices 150 of the comparative examples. A line Ln22 illustrated in FIG. 18 indicates radiation efficiency of the antenna device 150 of the antenna module 250B according to the modified example of Preferred Embodiment 2. A line Ln23 indicates radiation efficiency of the antenna device 150 of the antenna module 250A according to the comparative example to the modified example of Preferred Embodiment 2. A line Ln24 indicates radiation efficiency of the antenna device 150 of the antenna module 200Z according to another comparative example to the modified example of Preferred Embodiment 2. As described above, the antenna module 200Z has a configuration in which the filter device 100 is removed from the antenna module 200 in FIG. 10.

The radiation efficiency of the antenna module 250A of the comparative example is lower than the radiation efficiency of the antenna module 200Z of the comparative example in the frequency band, near the frequency f2s in particular, from the frequency f2s to the frequency f2c. On the other hand, the radiation efficiency of the antenna module 250B representing the modified example of Preferred Embodiment 2 is higher than the radiation efficiency of the antenna module 200Z of the comparative example in the frequency band from the frequency f2s to the frequency f2c. In other words, the radiation efficiency of the antenna module 250B representing the modified example of Preferred Embodiment 2 is improved more than the radiation efficiency of the antenna module 200Z of the comparative example in the entire range of the band f2 (the band from the frequency f2s to the frequency f2e).

FIG. 19 is a diagram illustrating isolation characteristics between the antenna device 150 and the antenna device 160 of the modified example of Preferred Embodiment 2. A line Ln25 indicates isolation between the antenna device 150 and the antenna device 160 of the antenna module 250B according to the modified example of Preferred Embodiment 2. A line Ln26 indicates isolation between the antenna device 150 and the antenna device 160 of the antenna module 200Z of the comparative example.

As illustrated in FIG. 19, the antenna module 250B has larger isolation than that of the antenna module 200Z in the entire range of the band f2. In other words, in the modified example of Preferred Embodiment 2, the isolation between the antenna device 150 and the antenna device 160 is improved more than that of the comparative example due to the attenuation of the frequency of the band f2 by the filter device 100B.

In the filter device 100B, the resonant frequency F2 is adjusted to be near the lower limit value of the band f2 being the attenuation band. Accordingly, the filter device 100B of Preferred Embodiment 2 can achieve high efficiency in the entire range of the band f2. Here, the resonant frequency F2 of the filter device 100B only needs to be a frequency near the lower limit value of the attenuation band, which may be a frequency lower than the lower limit value of the attenuation band.

Examples of Application to Respective Antennas

Figure 20:
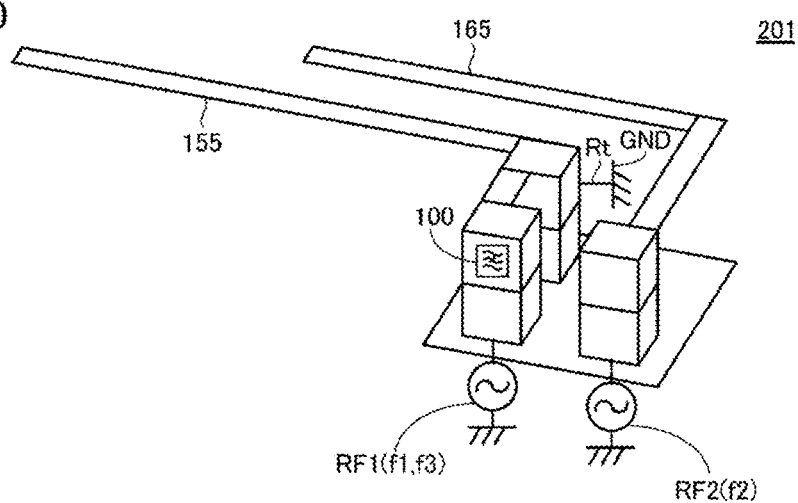
FIG. 20 is an appearance diagram of an antenna module which is an inverted-F antenna.

FIG. 20 is an appearance diagram of an antenna module 201 in which the antenna 155 is an inverted-F antenna. As illustrated in FIG. 20, the antenna 155 is structured as the inverted-F antenna. The antenna 165 is structured as a monopole antenna. As illustrated in FIG. 20, the antenna 155 is connected to the power supply circuit RF1 with the filter device 100 interposed therebetween.

As illustrated in FIG. 20, the antenna 155 being the inverted-F antenna branches off from a route connected to the power supply circuit RF1, and is connected to a ground electrode GND. In the following, a point from which the route connected to the power supply circuit RF1 and the route connected to the ground electrode GND branch off will be referred to as a branch point.

Figure 21:
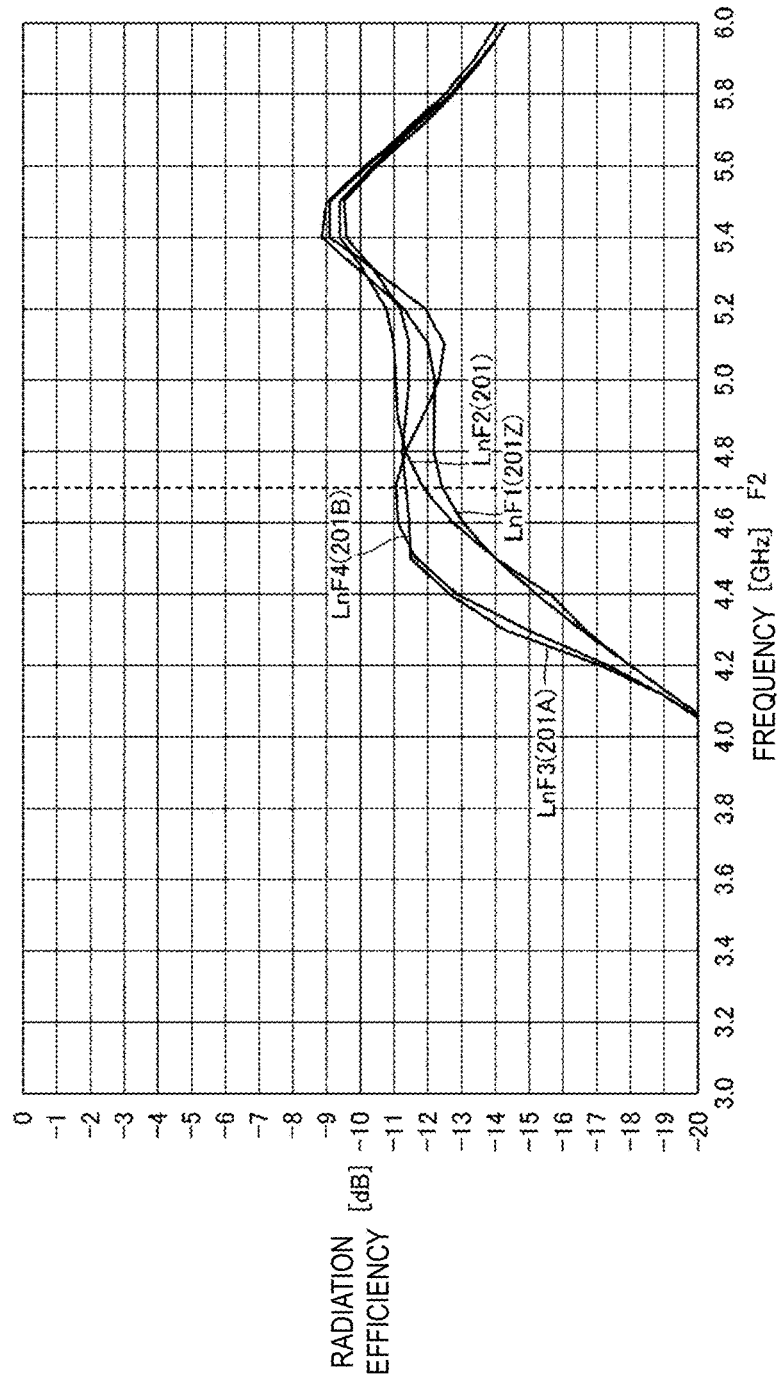
FIG. 21 is a diagram illustrating radiation efficiency of an antenna in the case of the inverted-F antenna.

FIG. 21 is a diagram illustrating radiation efficiency of the antenna 165 in the case where the antenna 155 is the inverted-F antenna. A line LnF1 indicates radiation efficiency of the antenna 165 of an antenna module 201Z of a comparative example. A line LnF2 indicates radiation efficiency of the antenna 165 of the antenna module 201 of Preferred Embodiment 2. A line LnF3 indicates radiation efficiency of the antenna 165 of an antenna module 201A of Modified Example 1. A line LnF4 indicates radiation efficiency of the antenna 165 of an antenna module 201B of Modified Example 2.

The antenna module 201Z of the comparative example does not include the filter device 100. In other words, the antenna module 201Z has a configuration in which the filter device 100 is removed from the antenna module 201 in FIG. 20.

The antenna module 201A of the Modified Example 1 has a configuration in which the filter device 100 is provided on a route Rt from the branch point to the ground electrode GND, instead of the filter device 100 being provided on the route from the branch point to the power supply circuit RF1.

The antenna module 201B of the Modified Example 2 has a configuration in which the filter device 100 is provided on the route from the branch point to the power supply circuit RF1, and another filter device 100 is also provided on the route Rt from the branch point to the ground electrode GND. In other words, the antenna device 150 of the antenna module 201B of the Modified Example 2 includes two filter devices 100.

As illustrated in FIG. 21, the radiation efficiency of the antenna 165 in the antenna module 201Z of the comparative example which does not include the filter device 100 is lowest. In other words, in Preferred Embodiment 2 as well as the Modified Examples 1 and 2 each including the inverted-F antenna, the radiation efficiency of the antenna 165 is improved more than the comparative example due to provision of the filter device 100.

Figure 22:
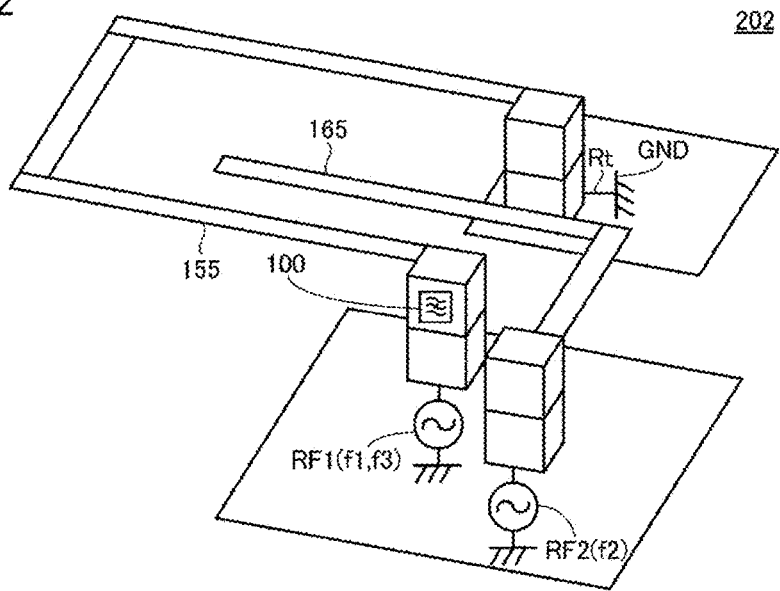
FIG. 22 is an appearance diagram of an antenna module which is a loop antenna.

FIG. 22 is an appearance diagram of an antenna module 202 in which the antenna 155 is a loop antenna. As illustrated in FIG. 22, the antenna 155 is structured as the loop antenna. The antenna 165 is structured as a monopole antenna. As illustrated in FIG. 22, the antenna 155 being the loop antenna is also connected to the ground electrode GND via a route Rt that is different from the route connected to the power supply circuit RF1.

Figure 23:
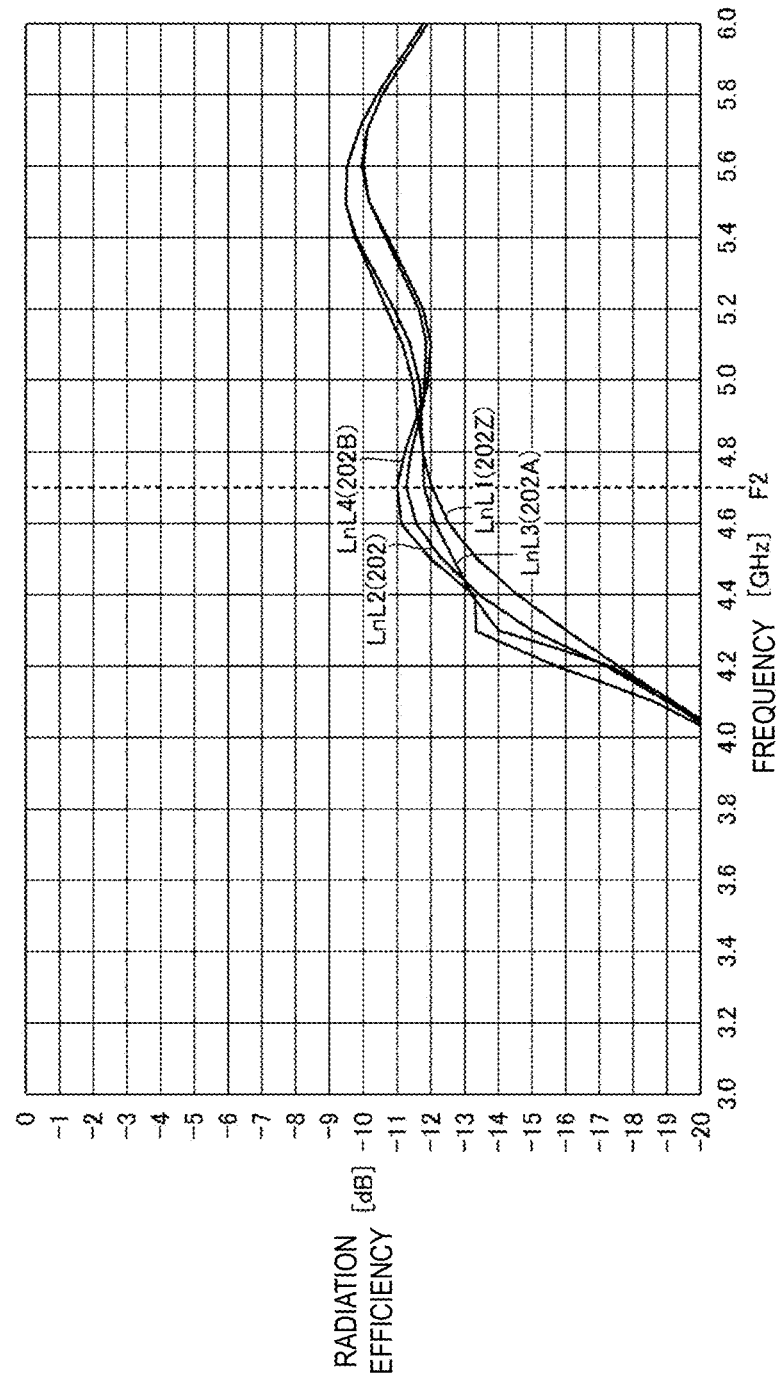
FIG. 23 is a diagram illustrating radiation efficiency of the antenna in the case of the loop antenna.

FIG. 23 is a diagram illustrating radiation efficiency of the antenna 165 in the case where the antenna 155 is the loop antenna. A line LnL1 indicates radiation efficiency of the antenna 165 of an antenna module 202Z of a comparative example. A line LnL2 indicates radiation efficiency of the antenna 165 of the antenna module 202 of Preferred Embodiment 2. A line LnL3 indicates radiation efficiency of the antenna 165 of an antenna module 202A of Modified Example 1. A line LnL4 indicates radiation efficiency of the antenna 165 of an antenna module 202B of Modified Example 2.

The antenna module 202Z of the comparative example has a configuration in which the filter device 100 is removed from the antenna module 202 in FIG. 22. The antenna module 202A of the Modified Example 1 has a configuration in which the filter device 100 is provided on the route Rt from the antenna 155 to the ground electrode GND, instead of the filter device 100 being disposed on the route from the antenna 155 to the power supply circuit RF1. The antenna module 202B of the Modified Example 2 has a configuration in which the filter device 100 is provided on the route from the antenna 155 to the power supply circuit RF1, and another filter device 100 is also provided on the route Rt from the antenna 155 to the ground electrode GND.

As illustrated in FIG. 23, the radiation efficiency of the antenna 165 in the antenna module 202Z of the comparative example which does not include the filter device 100 is lowest. In other words, in Preferred Embodiment 2 as well as the Modified Examples 1 and 2 each including the loop antenna, the radiation efficiency of the antenna 165 is improved more than the comparative example due to provision of the filter device 100.

Figure 24:
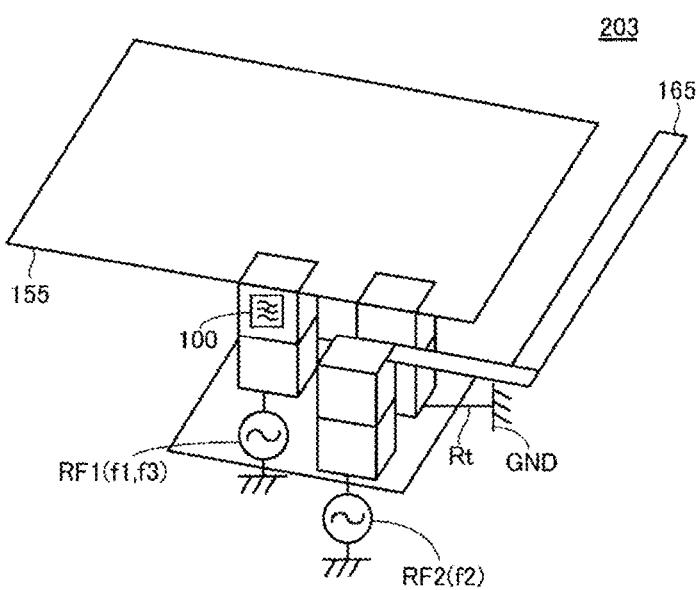
FIG. 24 is an appearance diagram of an antenna module which is a patch antenna.

FIG. 24 is an appearance diagram of an antenna module 203 in which the antenna 155 is a patch antenna. As illustrated in FIG. 24, the antenna 155 is structured as the patch antenna. The antenna 165 is structured as a monopole antenna. As illustrated in FIG. 24, the antenna 155 being the patch antenna is also connected to the ground electrode GND via a route Rt that is different from the route connected to the power supply circuit RF1.

Figure 25:
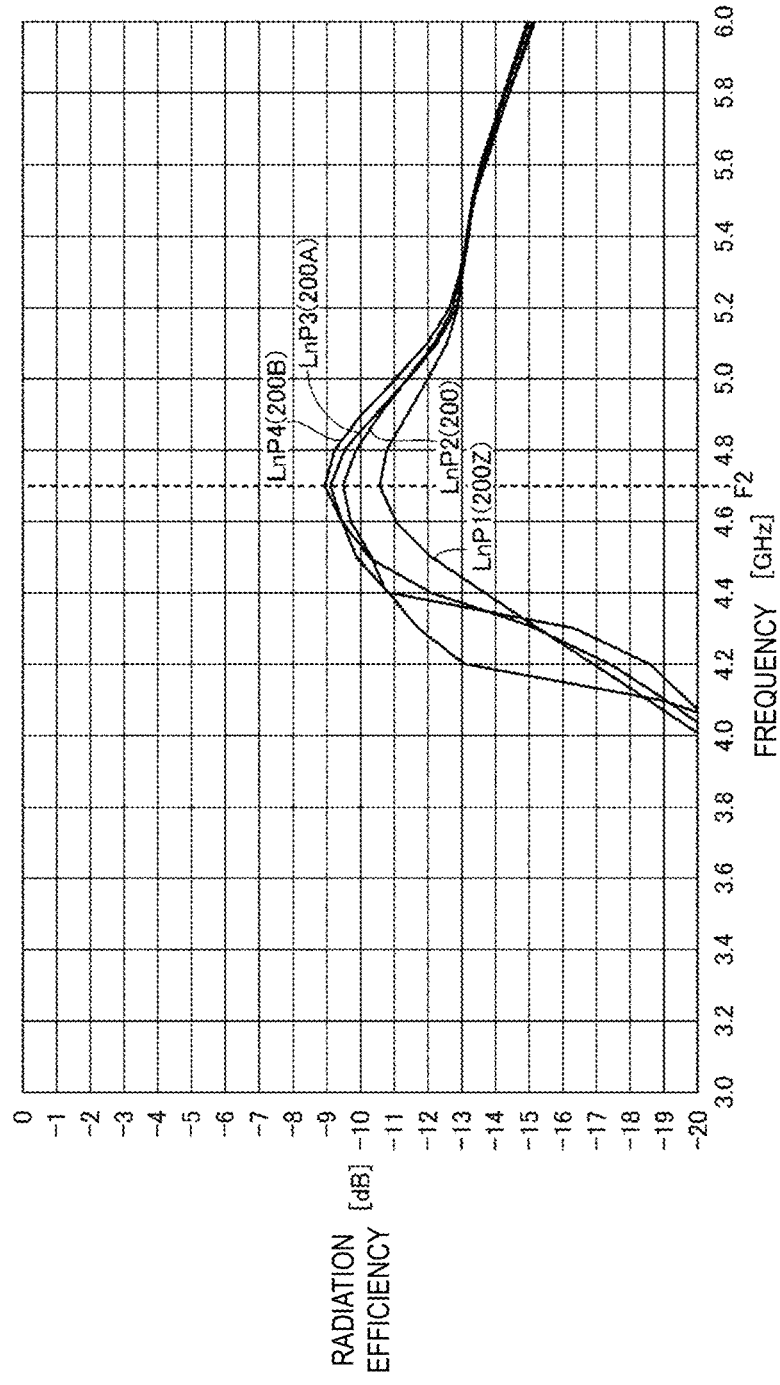
FIG. 25 is a diagram illustrating radiation efficiency of the antenna in the case of the patch antenna.

FIG. 25 is a diagram illustrating radiation efficiency of the antenna 165 in the case where the antenna 155 is the patch antenna. A line LnP1 indicates radiation efficiency of the antenna 165 of an antenna module 203Z of a comparative example. A line LnP2 indicates radiation efficiency of the antenna 165 of the antenna module 203 of Preferred Embodiment 2. A line LnP3 indicates radiation efficiency of the antenna 165 of an antenna module 203A of Modified Example 1. A line LnP4 indicates radiation efficiency of the antenna 165 of an antenna module 203B of Modified Example 2.

The antenna module 203Z of the comparative example has a configuration in which the filter device 100 is removed from the antenna module 203 in FIG. 24. The antenna module 203A of the Modified Example 1 has a configuration in which the filter device 100 is provided on the route Rt from the antenna 155 to the ground electrode GND instead of the filter device 100 being provided on the route from the antenna 155 to the power supply circuit RF1. The antenna module 203B of the Modified Example 2 has a configuration in which the filter device 100 is provided on the route from the antenna 155 to the power supply circuit RF1, and another filter device 100 is also provided on the route Rt from the antenna 155 to the ground electrode GND.

As illustrated in FIG. 25, the radiation efficiency of the antenna 165 in the antenna module 203Z of the comparative example which does not include the filter device 100 is lowest. In other words, in Preferred Embodiment 2 as well as the Modified Examples 1 and 2 each including the patch antenna, the radiation efficiency of the antenna 165 is improved more than the comparative example due to provision of the filter device 100.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device with a first frequency band as a pass band and a second frequency band as an attenuation band, the second frequency band being lower than the first frequency band, the filter device comprising:
   a first terminal;
   a second terminal;
   a first inductor connecting the first terminal to the second terminal; and
   an LC series resonator connected in parallel to the first inductor and including a first capacitor and a second inductor; wherein
   the first inductor and the second inductor are magnetically coupled to each other;
   an inductance of the first inductor is smaller than an inductance of the second inductor;
   the first terminal is an input terminal;
   the second terminal is an output terminal; and
   the filter device is an integrated component.

2. The filter device according to claim 1, wherein the first inductor and the second inductor are additive polarity coupled to each other.

3. The filter device according to claim 1, further comprising:
   a multilayer body including a plurality of dielectric layers that are laminated; wherein
   the filter device is provided as one component.

4. The filter device according to claim 3, wherein
   the first inductor is provided in at least one of the plurality of dielectric layers of the multilayer body and the second inductor is provided in at least one of the plurality of the dielectric layers layer of the multilayer body; and
   the first and second inductors are adjacent to each other.

5. The filter device according to claim 3, wherein an opening of the first inductor and an opening of the second inductor at least partially overlap in plan view of the multilayer body.

6. The filter device according to claim 1, wherein
   the first terminal is electrically connected to one end of the first inductor;
   the first terminal is electrically connected to one end of the second inductor; and
   a direction of a magnetic field generated at the first inductor and a direction of a magnetic field generated at the second inductor are opposite to each other when a current flows from a first terminal side to a second terminal side.

7. The filter device according to claim 1, further comprising:
   a multilayer body including a plurality of dielectric layers that are laminated; wherein
   the first inductor includes a third inductor and a fourth inductor provided in the multilayer body,
   the second inductor includes a fifth inductor and a sixth inductor provided in the multilayer body,
   the first capacitor includes a second capacitor and a third capacitor provided in the multilayer body, and the third inductor and the fourth inductor are adjacent to each other.

8. The filter device according to claim 7, wherein a winding direction of the third inductor is different from a winding direction of the fourth inductor in plan view of the multilayer body.

9. An antenna device comprising:
the filter device according to claim 1;
a first power supply circuit to supply a high-frequency signal;
a first antenna to emit a high-frequency wave in the first frequency band;
a first transmission line;
a second transmission line including one end connected to the first transmission line and another end connected to the filter device; and
a third transmission line including one end connected to the filter device and another end connected to the first antenna.

10. The antenna device according to claim 9, wherein
the first antenna is structured to emit a high-frequency wave in a third frequency band; and
the third frequency band is a frequency band lower than the second frequency band.

11. The antenna device according to claim 9, wherein
a characteristic impedance of the first transmission line is about 50Ω; and
a characteristic impedance of each of the second transmission line and the third transmission line is less than about 50Ω.

12. The antenna device according to claim 9, wherein the first inductor and the second inductor are additive polarity coupled to each other.

13. The antenna device according to claim 9, further comprising:
a multilayer body including a plurality of dielectric layers that are laminated; wherein
the filter device is provided as one component.

14. The antenna device according to claim 13, wherein the first inductor is provided in at least one of the plurality of dielectric layers of the multilayer body and the second inductor is provided in at least one of the plurality of the dielectric layers layer of the multilayer body; and
the first and second inductors are adjacent to each other.

15. An antenna module comprising:
the antenna device according to claim 9 defining a first antenna device;
a second power supply circuit to supply a high-frequency signal; and
a second antenna device including a second antenna capable to emit a high-frequency wave in the second frequency band; wherein
the first frequency band is a band located within a predetermined range from the second frequency band.

16. The antenna module according to claim 15, further comprising:
a substrate on which an antenna is mountable; wherein
the first antenna and the second antenna are mounted on the substrate.

17. The antenna module according to claim 15, wherein the first inductor and the second inductor are additive polarity coupled to each other.

18. The antenna module according to claim 15, wherein a center of an attenuation frequency is a lower limit of the second frequency band.

19. The antenna module according to claim 15, further comprising:
a multilayer body including a plurality of dielectric layers that are laminated; wherein
the filter device is provided as one component.

20. The antenna module according to claim 19, wherein
the first inductor is provided in at least one of the plurality of dielectric layers of the multilayer body and the second inductor is provided in at least one of the plurality of the dielectric layers layer of the multilayer body; and
the first and second inductors are adjacent to each other.

* * * * *